United States Patent
Park et al.

(10) Patent No.: US 12,230,671 B2
(45) Date of Patent: Feb. 18, 2025

(54) SEMICONDUCTOR DEVICES AND METHODS FOR FABRICATING THE SAME

(71) Applicant: Samsung Electronics Co., Ltd., Suwon-si (KR)

(72) Inventors: Jung Min Park, Seoul (KR); Han Jin Lim, Seoul (KR); Kyoo Ho Jung, Seoul (KR); Cheol Jin Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 111 days.

(21) Appl. No.: 17/412,393

(22) Filed: Aug. 26, 2021

(65) Prior Publication Data
US 2022/0238641 A1    Jul. 28, 2022

(30) Foreign Application Priority Data
Jan. 22, 2021 (KR) .................. 10-2021-0009158

(51) Int. Cl.
*H01L 27/08* (2006.01)
*H01L 49/02* (2006.01)

(52) U.S. Cl.
CPC .................................. *H01L 28/92* (2013.01)

(58) Field of Classification Search
CPC ........ H01L 28/92; H01L 28/75; H01L 28/90; H01L 29/516; H01L 29/785; H01L 29/66795; H01L 29/66545; H01L 29/78391; H10B 12/30; H10B 12/03; H10B 12/34; H10B 53/30; H10B 10/12; H10B 51/30; H10B 53/00; H10B 51/20
See application file for complete search history.

(56) References Cited

U.S. PATENT DOCUMENTS

| | | | |
|---|---|---|---|
| 6,720,607 B1 | 4/2004 | Basceri et al. | |
| 8,569,819 B1 | 10/2013 | Rui et al. | |
| 8,647,943 B2 | 2/2014 | Chen et al. | |
| 11,017,830 B1 * | 5/2021 | Lin | H10B 53/30 |
| 2001/0055851 A1 * | 12/2001 | Horii | H01L 21/31144 257/E21.252 |
| 2002/0113237 A1 * | 8/2002 | Kitamura | H10B 12/0335 257/E21.018 |
| 2003/0080329 A1 * | 5/2003 | Kurasawa | H10B 53/00 257/296 |
| 2008/0218936 A1 * | 9/2008 | Won | H01L 28/60 257/E21.011 |
| 2012/0077322 A1 * | 3/2012 | Hirota | H01L 28/40 257/E21.24 |
| 2016/0133691 A1 | 5/2016 | Phatak et al. | |

(Continued)

FOREIGN PATENT DOCUMENTS

| | | | |
|---|---|---|---|
| CN | 110828428 | * | 2/2020 |
| KR | 20000043579 A | | 7/2000 |
| KR | 20080098822 A | | 11/2008 |

*Primary Examiner* — Tony Tran
(74) *Attorney, Agent, or Firm* — Myers Bigel, P.A.

(57) ABSTRACT

Semiconductor devices are provided. The semiconductor devices includes a landing pad on a substrate, a lower electrode on the landing pad and connected to the landing pad, a capacitor dielectric film that is on the lower electrode and includes both a tetragonal crystal system and an orthorhombic crystal system, a first doping layer that is between the lower electrode and the capacitor dielectric film and includes a first metal, and an upper electrode on the capacitor dielectric film.

16 Claims, 25 Drawing Sheets

(56) References Cited

U.S. PATENT DOCUMENTS

| | | | |
|---|---|---|---|
| 2017/0103988 A1* | 4/2017 | Nishida | H01L 29/6684 |
| 2018/0323309 A1* | 11/2018 | Ando | H10B 53/30 |
| 2019/0355806 A1* | 11/2019 | Kang | C04B 35/58007 |
| 2020/0058658 A1* | 2/2020 | Heo | G11C 11/223 |
| 2020/0058731 A1* | 2/2020 | Mun | H10B 12/03 |
| 2020/0091278 A1 | 3/2020 | Jung et al. | |
| 2020/0286985 A1* | 9/2020 | Lim | H10B 12/31 |
| 2020/0312950 A1* | 10/2020 | Haratipour | H01G 4/30 |
| 2020/0395436 A1* | 12/2020 | Jung | H10B 12/315 |
| 2020/0395460 A1* | 12/2020 | Haratipour | H01L 29/151 |
| 2021/0140049 A1* | 5/2021 | Han | H01L 28/75 |
| 2021/0242304 A1* | 8/2021 | Lin | H10B 53/00 |
| 2021/0273039 A1* | 9/2021 | Kim | H10B 12/315 |
| 2021/0359100 A1* | 11/2021 | Maeng | H10B 51/00 |
| 2022/0085010 A1* | 3/2022 | Jung | H01L 28/60 |
| 2022/0139935 A1* | 5/2022 | Huang | H10B 51/30 257/295 |
| 2022/0181494 A1* | 6/2022 | Chen | H01L 29/6684 |
| 2022/0285374 A1* | 9/2022 | Lee | H10B 53/30 |
| 2023/0008127 A1* | 1/2023 | Jung | H10B 12/30 |
| 2023/0096911 A1* | 3/2023 | Im | H01L 28/91 257/295 |

* cited by examiner

SEMICONDUCTOR DEVICES AND METHODS FOR FABRICATING THE SAME

This application claims priority to Korean Patent Application No. 10-2021-0009158, filed on Jan. 22, 2021, in the Korean Intellectual Property Office, the disclosure of which is incorporated herein in its entirety by reference.

BACKGROUND

The present disclosure relates to a semiconductor device and a method for fabricating the same.

A buried channel array transistor (BCAT) may include a gate electrode buried in a trench to overcome a short channel effect of a DRAM structure.

On the other hand, as semiconductor elements are increasingly highly integrated, individual circuit patterns have been further miniaturized to implement more semiconductor elements in the same area. That is, the design rules of the components of the semiconductor element decrease. As DRAM devices are also highly integrated, an amount of charge charged in capacitors steadily decreases. Therefore, research for increasing the amount of charges stored in the capacitors and improving leakage characteristics is being conducted.

SUMMARY

The present disclosure provides semiconductor devices and methods for fabricating the semiconductor devices in which a capacitor dielectric film includes both a tetragonal crystal system and an orthorhombic crystal system, by disposing a doping layer including a metal having valence electrons of tetravalence or more between a lower electrode and a capacitor dielectric film. As a result, the dielectric constant of the capacitor dielectric film may be increased, and the capacitance of the capacitor may be increased.

According to some embodiments of the present disclosure, there is provided a semiconductor device, comprising a landing pad on a substrate, a lower electrode on the landing pad and connected to the landing pad, a capacitor dielectric film that is on the lower electrode and includes both a tetragonal crystal system and an orthorhombic crystal system, a first doping layer that is between the lower electrode and the capacitor dielectric film and include a first metal, and an upper electrode on the capacitor dielectric film.

According to some embodiments of the present disclosure, there is provided a semiconductor device, comprising a trench in a substrate, a gate electrode that is in (e.g., filling a portion of) the trench, a buried contact that is on at least one side of the gate electrode and is connected (e.g., electrically connected) to the substrate, a landing pad on the buried contact, an etching stop layer on the landing pad, a first supporter pattern on the etching stop layer, a second supporter pattern spaced apart from the first supporter pattern on the first supporter pattern, a lower electrode that is in contact with side walls of the first supporter pattern and the second supporter pattern, a capacitor dielectric film that is on the lower electrode, the first supporter pattern, and the second supporter pattern and includes both a tetragonal crystal system and an orthorhombic crystal system, a first doping layer that is between the lower electrode and the capacitor dielectric film and includes (e.g., by doping with) a first metal having valence electrons of tetravalence or more, and an upper electrode on the capacitor dielectric film.

According to some embodiments of the present disclosure, there is provided a method for fabricating a semiconductor device, comprising sequentially stacking an etching stop layer, a first mold layer, a first supporter layer, a second mold layer, and a second supporter layer on a substrate, forming a lower electrode pattern that vertically penetrates the etching stop layer, the first mold layer, the first supporter layer, the second mold layer, and the second supporter layer, removing the first mold layer and the second mold layer to expose the lower electrode pattern, forming a first metal layer including a first metal on the exposed lower electrode pattern, forming a first doping layer by doping a portion of the lower electrode pattern with the first metal of the first metal layer, removing the first metal layer, forming a capacitor dielectric film on the first doping layer, and forming an upper electrode on the capacitor dielectric film, wherein the capacitor dielectric film includes both a tetragonal crystal system and an orthorhombic crystal system.

According to some embodiments of the present disclosure, there is provided a semiconductor device, comprising a capacitor that includes a first electrode and a second electrode, a capacitor dielectric film extending between the first electrode and the second electrode and including both a tetragonal crystal system and an orthorhombic crystal system, and a first doping layer that is between the first electrode and the capacitor dielectric film and includes a first metal having four or more valence electrons.

However, the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF DRAWINGS

The above and other aspects and features of the present disclosure will become more apparent by describing in detail some embodiments thereof referring to the attached drawings, in which.

DETAILED DESCRIPTION

Hereinafter, a semiconductor device according to some embodiments of the present disclosure will be described referring to FIGS. 1 to 3.

Figure 1:
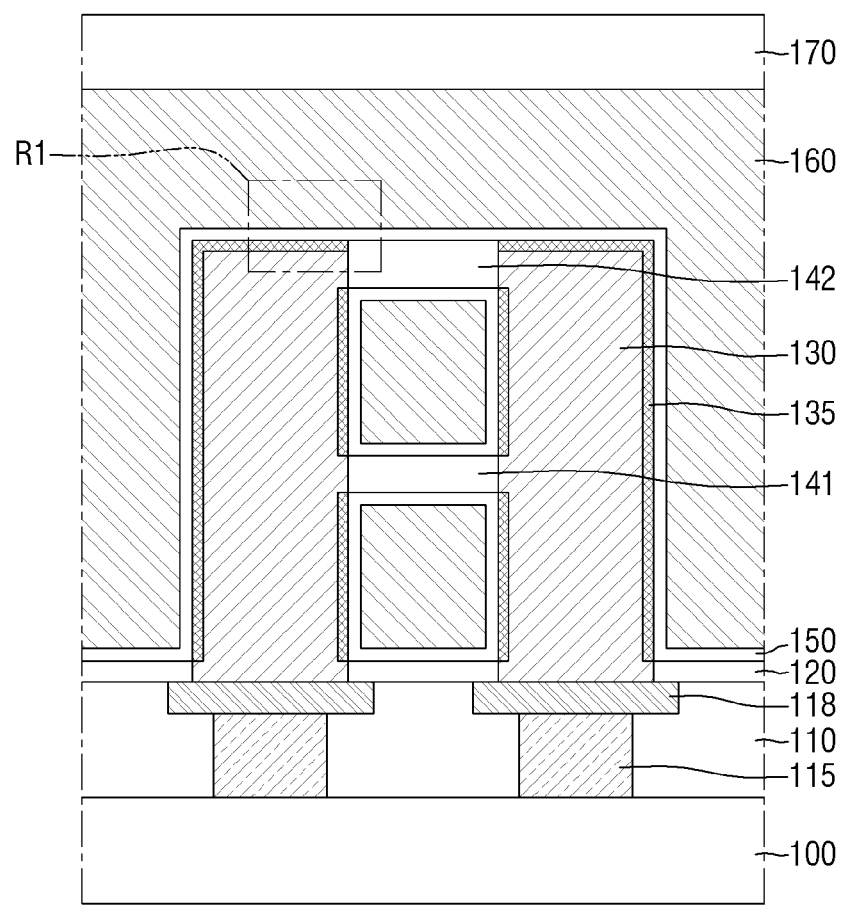
FIG. 1 is a diagram for explaining a semiconductor device according to some embodiments of the present disclosure.
Figure 1:
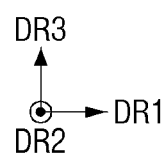

FIG. 1 is a diagram for explaining a semiconductor device according to some embodiments of the present disclosure. FIG. 2 is an enlarged view of a region R1 of FIG. 1. FIG. 3 is a graph of polarization-electric field of the semiconductor device according to some embodiments of the present disclosure.

Figure 2:
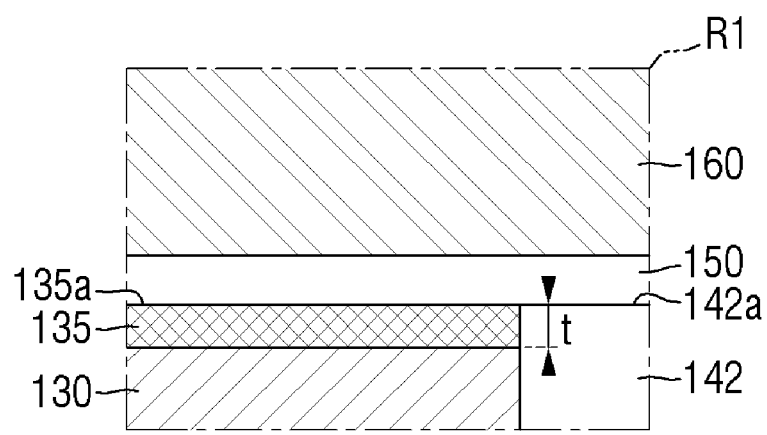
FIG. 2 is an enlarged view of a region R1 of FIG. 1.
Figure 2:
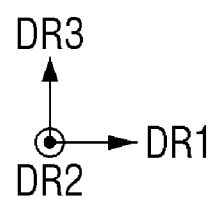
Figure 3:
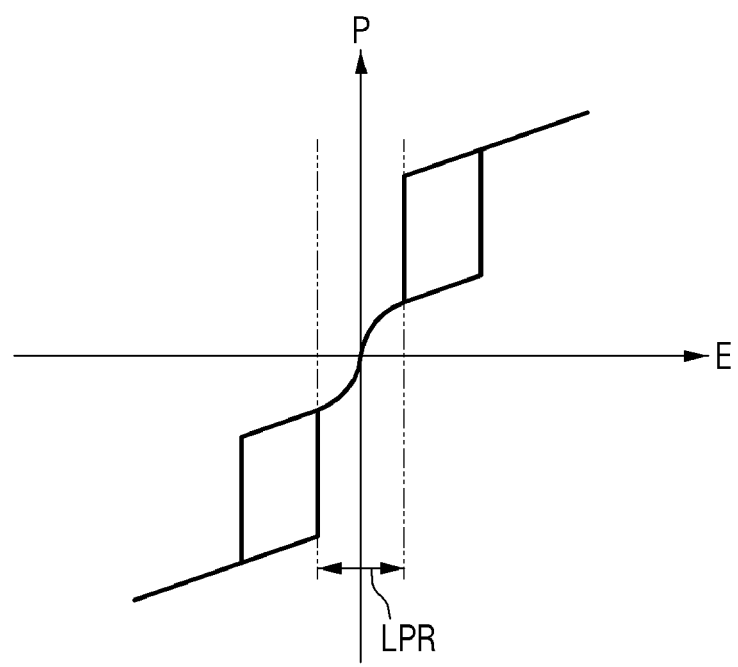
FIG. 3 is a graph of polarization-electric field of a semiconductor device according to some embodiments of the present disclosure.

Referring to FIGS. 1 to 3, the semiconductor device according to some embodiments of the present disclosure includes a substrate 100, a first interlayer insulating film 110, a storage contact 115, a landing pad 118, an etching stop layer 120, a lower electrode 130, a first doping layer 135, a first supporter pattern 141, a second supporter pattern 142, a capacitor dielectric film 150, an upper electrode 160, and a second interlayer insulating film 170.

The substrate 100 may be bulk silicon or SOI (silicon-on-insulator). In some embodiments, the substrate 100 may be a silicon substrate, or may include other materials, but are not limited to, for example, silicon germanium, SGOI (silicon germanium on insulator), indium antimonide, lead tellurium compounds, indium arsenic, indium phosphide, gallium arsenide or gallium antimonide. In the following description, the substrate 100 will be described as a silicon substrate.

Although not shown, a gate electrode used as a word line may be disposed inside the substrate 100. A unit active region and an element separation region may be formed on the substrate 100. For example, two transistors may be formed inside a single unit active region.

The first interlayer insulating film 110 may be disposed on the substrate 100. The first interlayer insulating film 110 may include, for example, at least one of silicon oxide (Sift), silicon nitride (SiN), and silicon oxynitride (SiON). The first interlayer insulating film 110 may be a single layer or multi-layers.

The storage contact 115 may be disposed inside the first interlayer insulating film 110 on the substrate 100. The landing pad 118 may be disposed inside the first interlayer insulating film 110 on the substrate 100. The landing pad 118 may be disposed on the storage contact 115. The landing pad 118 may be connected to the substrate 100 via the storage contact 115. The landing pad 118 may be electrically connected to a conductive region formed on or inside the substrate 100.

The etching stop layer 120 may be disposed on the first interlayer insulating film 110. The etching stop layer 120 may surround a part of the side wall of the lower electrode 130 formed adjacent to an upper surface of the first interlayer insulating film 110.

The etching stop layer 120 may include a material having an etching selectivity with respect to a first mold layer (e.g., a first mold layer 10 of FIG. 4) and a second mold layer (e.g., a second mold layer 20 of FIG. 4) including an oxide. The etching stop layer 120 may include, for example, at least one of silicon nitride (SiN), silicon carbonitride (SiCN), silicon boronitride (SiBN), silicon carbon oxide (SiCO), silicon oxynitride (SiON), silicon oxide (SiO), and silicon oxyarbonitride (SiOCN). For example, silicon carbon oxide (SiCO) includes silicon (Si), carbon (C) and oxygen (O), but does not mean a ratio between silicon (Si), carbon (C) and oxygen (O). A ratio between silicon (Si), carbon (C) and oxygen (O) may not be 1:1:1.

The lower electrode 130 may be disposed on the landing pad 118. The lower electrode 130 is connected to the landing pad 118. The lower electrode 130 may extend longitudinally in a vertical direction DR3. The length of the lower electrode 130 in the vertical direction DR3 is greater than the length of the lower electrode 130 extending in a first horizontal direction DR1. Alternatively, the length of the lower electrode 130 in the vertical direction DR3 is greater than a width of the lower electrode 130 in the first horizontal direction DR1. The lower electrode 130 may have, for example, a pillar shape. On a lower surface of the lower electrode 130, a part of the lower side wall of the lower electrode 130 may be in contact with the etching stop layer 120. As used herein, "an element A extends in a direction X" (or similar language) means that the element A extends longitudinally in the direction X.

Although the lower electrode 130 may include, for example, a doped semiconductor material, a conductive metal nitride (e.g., titanium nitride, tantalum nitride, niobium nitride or tungsten nitride, etc.), a metal (e.g., ruthenium, iridium, titanium or tantalum, etc.), and a conductive metal oxide (e.g., iridium oxide, niobium oxide, etc.), the present disclosure is not limited thereto.

The first supporter pattern 141 may be disposed on the etching stop layer 120. The first supporter pattern 141 may be spaced apart from the etching stop layer 120 in the vertical direction DR3. The first supporter pattern 141 may be in contact with the lower electrode 130. The first supporter pattern 141 may be in contact with a part of the side wall of the lower electrode 130.

For example, the first supporter pattern 141 may connect the lower electrodes 130 adjacent to each other in the first horizontal direction DR1. Although FIG. 1 shows that the two lower electrodes 130 are connected by the first supporter pattern 141, this is for convenience of explanation, and the present disclosure is not limited thereto.

The second supporter pattern 142 may be disposed on the first supporter pattern 141. The second supporter pattern 142 may be spaced apart from the first supporter pattern 141 in the vertical direction DR3. The second supporter pattern 142 may be in contact with the lower electrode 130. The second supporter pattern 142 may be in contact with a part of the side wall of the lower electrode 130.

For example, the second supporter pattern 142 may connect the lower electrodes 130 adjacent to each other in the first horizontal direction DR1. Although FIG. 1 shows that the two lower electrodes 130 are connected by the second supporter pattern 142, this is for convenience of explanation, and the present disclosure is not limited thereto.

Each of the first supporter pattern 141 and the second supporter pattern 142 may include, for example, at least one of silicon nitride (SiN), silicon carbonitride (SiCN), silicon boronitride (SiBN), silicon carbon oxide (SiCO), silicon oxynitride (SiON), silicon oxide (SiO), and silicon oxycarbonitride (SiOCN).

A thickness of the first supporter pattern 141 in the vertical direction DR3 may be smaller than a thickness of the second supporter pattern 142 in the vertical direction DR3. In some other embodiments, only one of the first supporter pattern 141 and the second supporter pattern 142 may be disposed on the side walls of the lower electrode 130. Also, in some other embodiments, an additional supporter pattern may be disposed between the etching stop layer 120 and the first supporter pattern 141, or between the first supporter pattern 141 and the second supporter pattern 142.

The capacitor dielectric film 150 may be disposed on the lower electrode 130. The capacitor dielectric film 150 may be disposed along the side walls and upper surface of the lower electrode 130. Further, the capacitor dielectric film 150 may be disposed along the upper surface of the etching stop layer 120, the upper surface and the lower surface of the first supporter pattern 141, and the upper surface and the lower surface of the second supporter pattern 142. The capacitor dielectric film 150 may be in contact with each of the upper surface of the etching stop layer 120, the upper surface and the lower surface of the first supporter pattern 141, and the upper surface and the lower surface of the second supporter pattern 142.

The capacitor dielectric film 150 is not disposed between the lower electrode 130 and the first supporter pattern 141, and between the lower electrode 130 and the second supporter pattern 142. Further, the capacitor dielectric film 150 is not disposed between the lower electrode 130 and the etching stop layer 120.

Although the capacitor dielectric film 150 may include, for example, one of silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combination thereof, the present disclosure are not limited thereto. Although the capacitor dielectric film 150 is shown as a single film in FIG. 1, the present disclosure is not limited thereto. In some embodiments, the capacitor dielectric film 150 may include multiple layers.

The capacitor dielectric film 150 may include both a tetragonal crystal system and an orthorhombic crystal system. FIG. 3 shows a polarization (P)-electric field (E) curve of the capacitor dielectric film 150 including both the tetragonal crystal system and the orthorhombic crystal system. The dielectric constant of a material may be proportional to a slope (dP/dE) of the polarization (P)-electric field (E) curve. That is, considering the definition of capacitance, capacitance may be proportional to the slope (dP/dE) of the polarization (P)-electric field (E) curve.

As shown in FIG. 3, when the capacitor dielectric film 150 includes both the tetragonal crystal system and the orthorhombic crystal system, it is possible to know that the slope of the polarization (P)-electric field (E) curve in a low-voltage region LPR increases. That is, it is possible to know that the dielectric constant increases in the capacitor dielectric film 150 including both the tetragonal crystal system and the orthorhombic crystal system.

Referring to FIGS. 1 and 2 again, the first doping layer 135 may be disposed between the lower electrode 130 and the capacitor dielectric film 150. The first doping layer 135 may be in contact with each of the lower electrode 130 and the capacitor dielectric film 150. The first doping layer 135 may be formed by doping the lower electrode pattern (130p of FIG. 6) with the first metal.

The first doping layer 135 may be disposed along the side walls and upper surface of the lower electrode 130. The first doping layer 135 is not disposed between the lower electrode 130 and the etching stop layer 120, between the lower electrode 130 and the first supporter pattern 141, and between the lower electrode 130 and the second supporter patterns 142.

The first metal doped in the first doping layer 135 may have valence electrons of tetravalence or more. The first metal may include four or more valence electrons. The first metal may include, for example, at least one of ruthenium (Ru), tungsten (W), molybdenum (Mo), vanadium (V), chromium (Cr), manganese (Mn), niobium (Nb), and tantalum (Ta). For example, the first doping layer 135 includes the first metal in an amount of 2 at % to 10 at %.

A thickness t of the first doping layer 135 may be, for example, 5 Å to 10 Å. An uppermost surface 135a of the first doping layer 135 may be formed on the same plane as an uppermost surface 142a of the second supporter pattern 142.

The upper electrode 160 may be disposed on the capacitor dielectric film 150. The upper electrode 160 may be disposed to cover the side wall and the upper surface of the lower electrode 130. Further, the upper electrode 160 may be disposed between the etching stop layer 120 and the first supporter pattern 141, and between the first supporter pattern 141 and the second supporter pattern 142.

Although the upper electrode 160 may include, for example, a doped semiconductor material, a conductive metal nitride (e.g., titanium nitride, tantalum nitride, niobium nitride or tungsten nitride, etc.), a metal (e.g., ruthenium, iridium, titanium or, tantalum, etc.), and a conductive metal oxide (e.g., iridium oxide, niobium oxide, etc.), the present disclosure is not limited thereto.

The second interlayer insulating film 170 may be disposed on the upper electrode 160. The second interlayer insulating film 170 may include, for example, at least one of silicon oxide, silicon nitride, silicon oxynitride film (SiON), silicon oxycarbonitride film (SiOCN), and a combination thereof.

In the semiconductor device according to some embodiments of the present disclosure, by disposing the first doping layer 135 doped with a metal having valence electrons of tetravalence or more between the lower electrode 130 and the capacitor dielectric film 150, the capacitor dielectric film 150 may include both the tetragonal crystal system and the orthorhombic crystal system. Therefore, the semiconductor device according to some embodiments of the present disclosure may increase the dielectric constant of the capacitor dielectric film 150 to increase the capacitance of the capacitor.

A method for fabricating a semiconductor device according to some embodiments of the present disclosure will be described below referring to FIGS. 1, 4 to 8.

FIGS. 4 to 8 are intermediate stage diagrams for explaining methods for fabricating a semiconductor device in some embodiments of the present disclosure.

Figure 4:
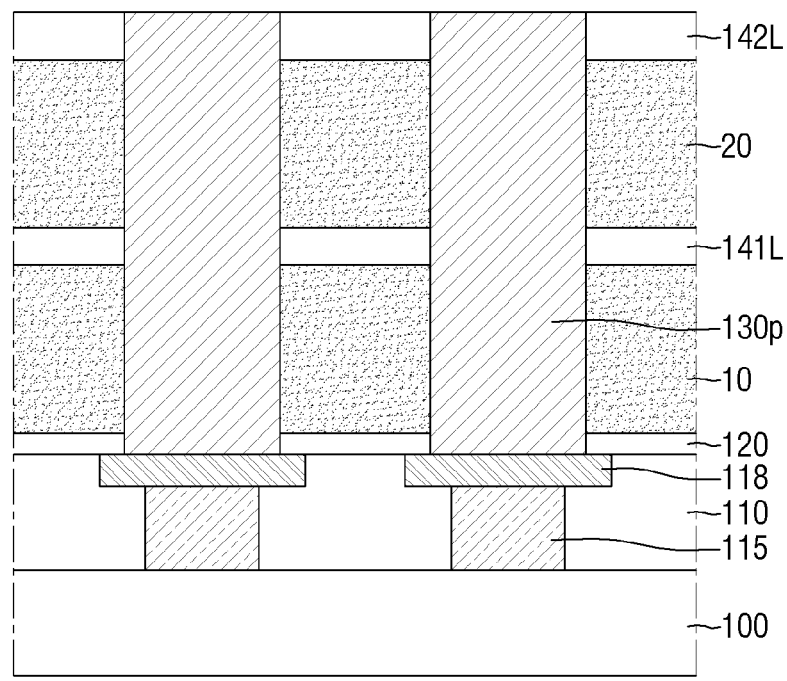
FIGS. 4 to 8 are diagrams for explaining a method for fabricating a semiconductor device according to some embodiments of the present disclosure.
Figure 4:
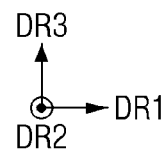

Referring to FIG. 4, the storage contact 115 and the landing pad 118 may be formed inside the first interlayer insulating film 110 on the substrate 100. Subsequently, the etching stop layer 120, the first mold layer 10, the first supporter layer 141L, the second mold layer 20, and the second supporter layer 142L may be formed sequentially on the first interlayer insulating film 110.

Subsequently, a lower electrode pattern 130p that penetrates each of the etching stop layer 120, the first mold layer 10, the first supporter layer 141L, the second mold layer 20, and the second supporter layer 142L in the vertical direction DR3 may be formed on the landing pad 118.

Figure 5:
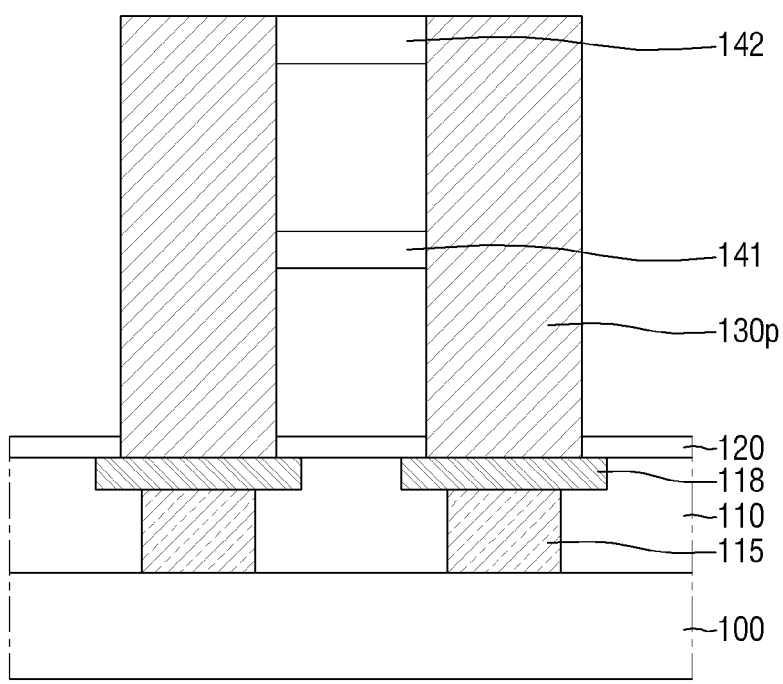
Figure 5:
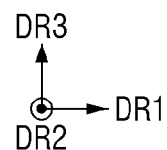

Referring to FIG. 5, the first supporter pattern 141 and the second supporter pattern 142 which connect adjacent lower electrodes 130 may be formed. Each of the first supporter pattern 141 and the second supporter pattern 142 may be in contact with a part of the side walls of the lower electrode 130.

The second supporter pattern 142 may be formed by removing a part of the second supporter layer 142L. The second mold layer 20 may be removed through a region in which the second supporter pattern 142 is not formed. Subsequently, the first supporter pattern 141 may be formed by removing a part of the first supporter layer 141L. The first mold layer 10 may be removed through the region in which the first supporter pattern 141 is not formed. The side walls of the lower electrode pattern 130p may be exposed, by removing the first mold layer 10 and the second mold layer 20. Accordingly, a space may be formed between the etching stop layer 120 and the first supporter pattern 141, and between the first supporter pattern 141 and the second supporter pattern 142.

Figure 6:
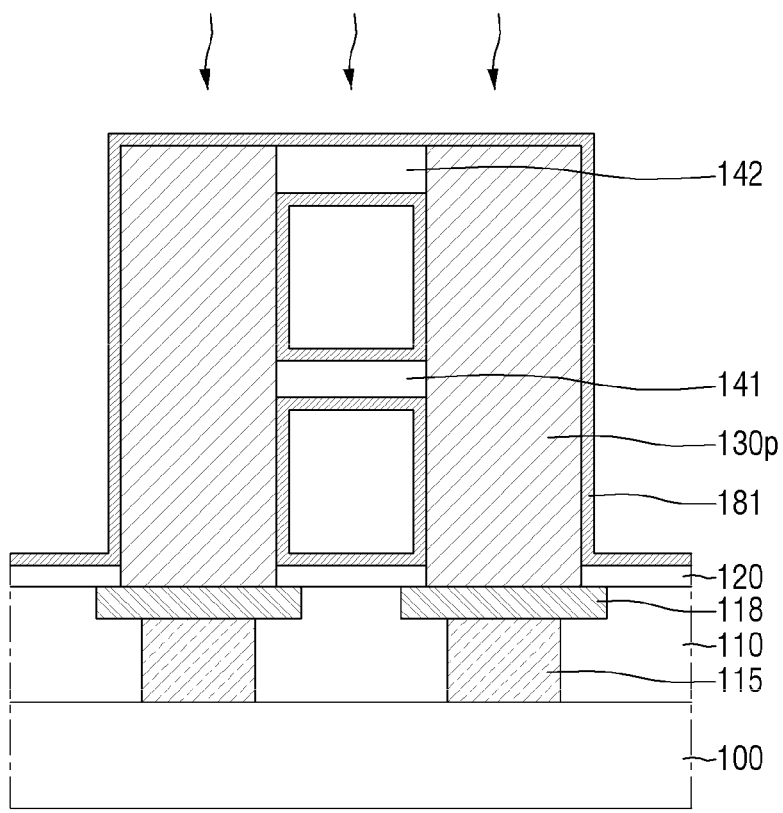
Figure 6:
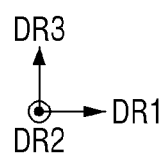

Referring to FIG. 6, a first metal layer 181 including the first metal may be formed on the exposed lower electrode pattern 130p. The first metal may have, for example, valence electrons of tetravalence or more. The first metal may include, for example, at least one of ruthenium (Ru), tungsten (W), molybdenum (Mo), vanadium (V), chromium (Cr), manganese (Mn), niobium (Nb), and tantalum (Ta).

The first metal layer 181 may also be formed on the upper surface of the etching stop layer 120, the lower surface and the upper surface of the first supporter pattern 141, and the lower surface and the upper surface of the second supporter pattern 142. Subsequently, an annealing process may be performed on the first metal layer 181. The annealing process may be performed, for example, within a temperature range of 200° C. to 700° C.

Figure 7:
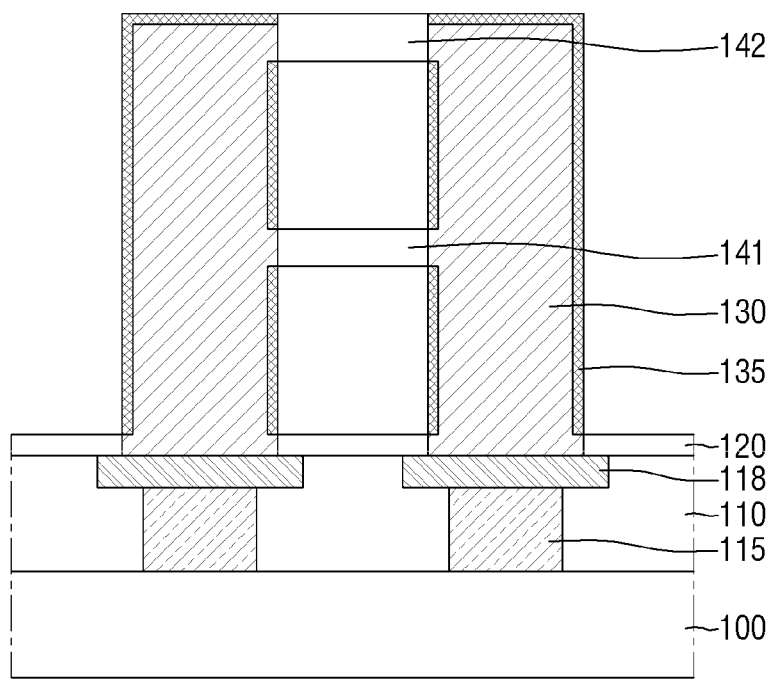

Referring to FIG. 7, by doping the first metal inside the lower electrode pattern 130p using the first metal layer 181 through the annealing process, the first doping layer 135 may be formed. The first doping layer 135 is not formed between the lower electrode 130 and the etching stop layer 120, between the lower electrode 130 and the first supporter pattern 141, and between the lower electrode 130 and the second supporter pattern 142.

The remaining portions of the lower electrode pattern 130p, except the portion in which the first doping layer 135 is formed, may be formed as the lower electrode 130. The first doping layer 135 may be formed, for example, at a thickness of 5 Å to 10 Å.

Subsequently, the first metal layer 181 may be removed. Accordingly, the first doping layer 135 may be exposed.

Figure 8:
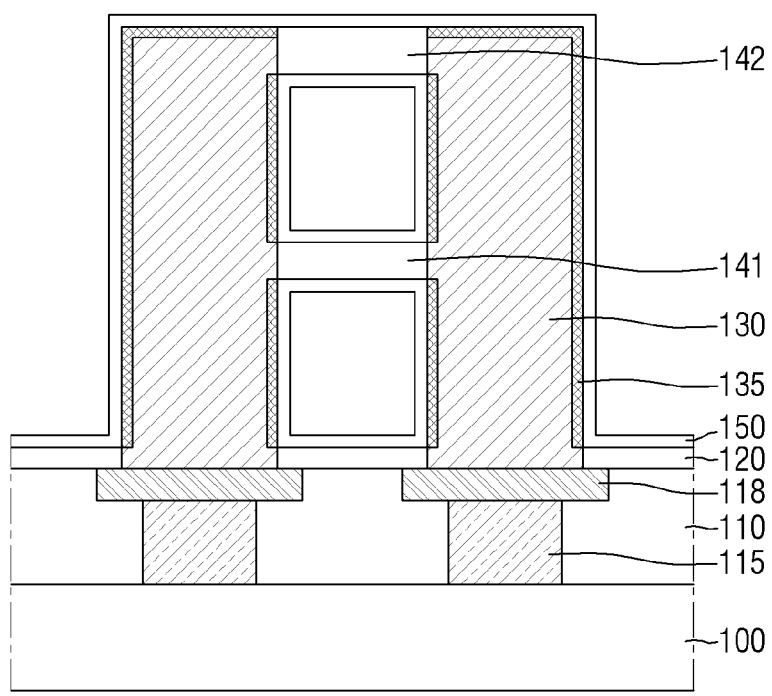
Figure 8:
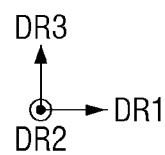

Referring to FIG. 8, the capacitor dielectric film 150 may be formed on the first doping layer 135. The capacitor dielectric film 150 may also be formed on the upper surface of the etching stop layer 120, the lower surface and the upper surface of the first supporter pattern 141, and the lower surface and the upper surface of the second supporter pattern 142.

The capacitor dielectric film 150 may have both the tetragonal crystal system and the orthorhombic crystal system, by the first metal having valence electrons of tetravalence or more doped in the first doping layer 135.

Referring to FIG. 1, the upper electrode 160 may be formed on the capacitor dielectric film 150. The upper electrode 160 may be formed to cover the side wall and the upper surface of the lower electrode 130. Further, the upper electrode 160 may be formed between the etching stop layer 120 and the first supporter pattern 141, and between the first supporter pattern 141 and the second supporter pattern 142.

Subsequently, by forming the second interlayer insulating film 170 on the upper electrode 160, the semiconductor device shown in FIG. 1 may be fabricated.

A semiconductor device according to some other embodiments of the present disclosure will be described below referring to FIGS. 9 and 10. Differences from the semiconductor device shown in FIGS. 1 and 2 will be mainly described.

Figure 9:
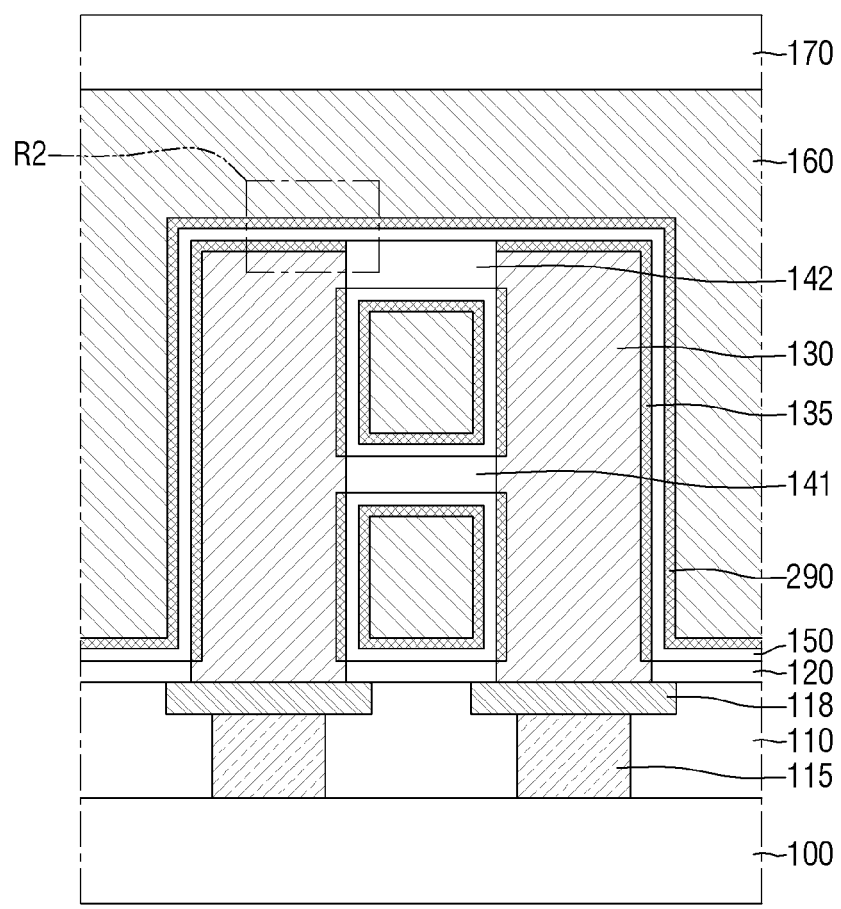
FIG. 9 is a diagram for explaining a semiconductor device according to some other embodiments of the present disclosure.

FIG. 9 is a diagram for explaining a semiconductor device according to some other embodiments of the present disclosure. FIG. 10 is an enlarged view of a region R2 of FIG. 9.

Figure 10:
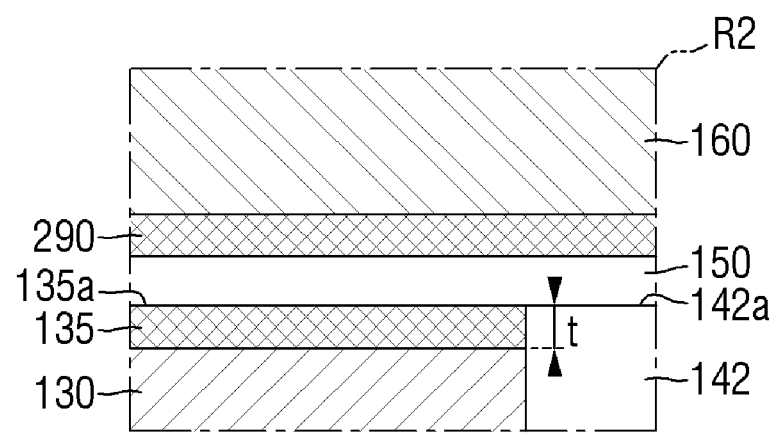
FIG. 10 is an enlarged view of a region R2 of FIG. 9.
Figure 10:
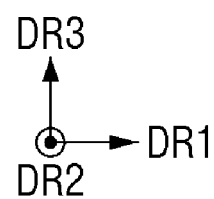

Referring to FIGS. 9 and 10, in the semiconductor device according to some other embodiments of the present disclosure, a second doping layer 290 may be disposed between the capacitor dielectric film 150 and the upper electrode 160. The second doping layer 290 may be in contact with each of the capacitor dielectric film 150 and the upper electrode 160.

The second doping layer 290 may be disposed along the profile of the capacitor dielectric film 150. The second doping layer 290 may be doped with a second metal. The second metal doped in the second doping layer 290 may have valence electrons of tetravalence or more. The second metal may include four or more valence electrons. The second metal may include, for example, at least one of ruthenium (Ru), tungsten (W), molybdenum (Mo), vanadium (V), chromium (Cr), manganese (Mn), niobium (Nb), and tantalum (Ta). For example, the second metal may have 2 at % to 10 at % atomic percent inside the second doping layer 290.

Hereinafter, the semiconductor device according to some other embodiments of the present disclosure will be described referring to FIGS. 11 and 12. Differences from the semiconductor devices shown in FIGS. 1 and 2 will be mainly described.

Figure 11:
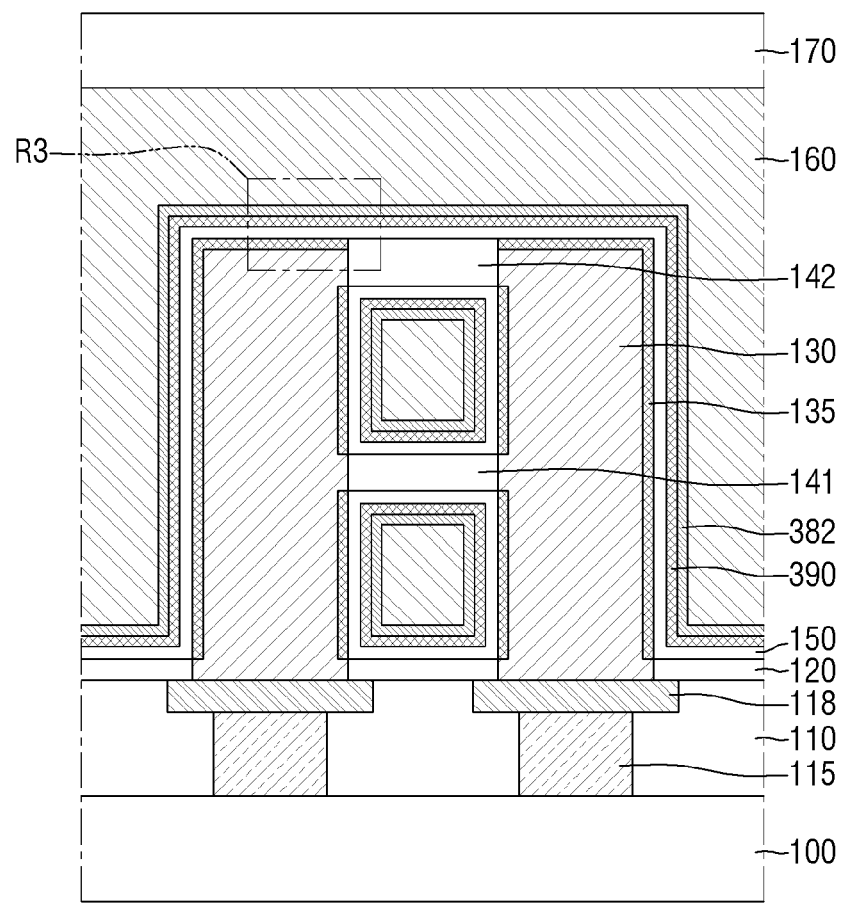
FIG. 11 is a diagram for explaining a semiconductor device according to some other embodiments of the present disclosure.
Figure 11:
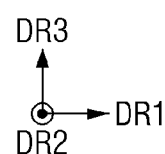

FIG. 11 is a diagram for explaining a semiconductor device according to some other embodiments of the present disclosure. FIG. 12 is an enlarged view of a region R3 of FIG. 11.

Figure 12:
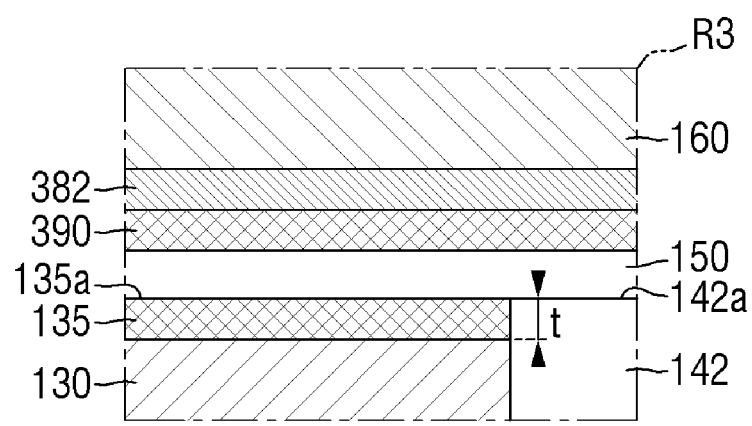
FIG. 12 is an enlarged view of a region R3 of FIG. 11.

Referring to FIGS. 11 and 12, the semiconductor device according to some other embodiment of the present disclosure may have a second metal layer 382 disposed between a second doping layer 390 and the upper electrode 160. The second metal layer 382 may be in contact with each of the second doping layer 390 and the upper electrode 160.

The second metal layer 382 may be disposed along the profile of the second doping layer 390. The second metal layer 382 may include a second metal. The second metal may have, for example, valence electrons of tetravalence or more. The second metal may include four or more valence electrons. The second metal may include, for example, at least one of ruthenium (Ru), tungsten (W), molybdenum (Mo), vanadium (V), chromium (Cr), manganese (Mn), niobium (Nb), and tantalum (Ta).

By diffusing the second metal included in the second metal layer 382 through the annealing process, the second doping layer 390 may be formed.

A method for fabricating a semiconductor device according to some other embodiments of the present disclosure will be described below referring to FIGS. 9, 10, 13, and 14.

Figure 13:
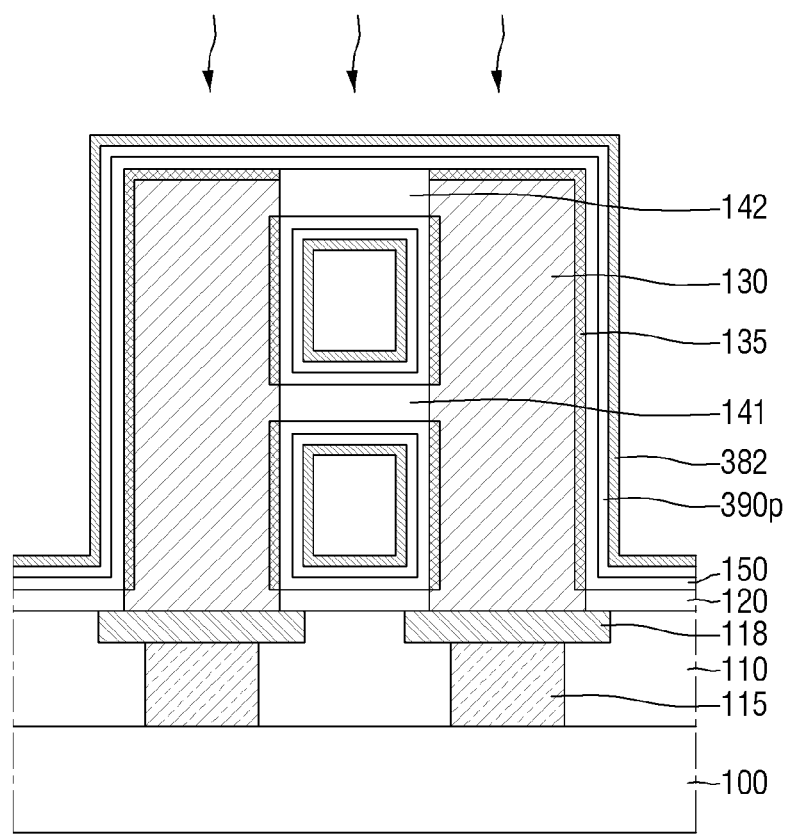
FIGS. 13 and 14 are diagrams for explaining a method for fabricating a semiconductor device according to some other embodiments of the present disclosure.
Figure 13:
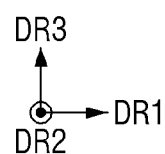
Figure 14:
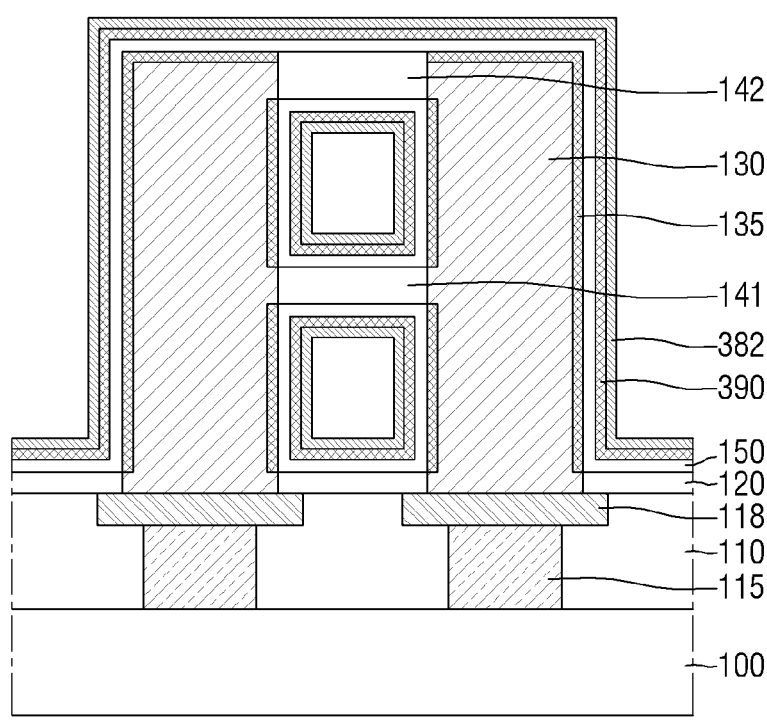

FIGS. 13 and 14 are intermediate stage diagrams for explaining the method for fabricating a semiconductor device according to some other embodiments of the present disclosure.

Referring to FIG. 13, after the fabricating processes shown in FIGS. 4 to 8 are performed, a pre-doping layer 390p and a second metal layer 382 may be sequentially stacked on the capacitor dielectric film 150.

Specifically, the pre-doping layer 390p may be formed on the capacitor dielectric film 150. The pre-doping layer 390p may be formed along the profile of the capacitor dielectric film 150. Although the pre-doping layer 390p may include, for example, a doped semiconductor material, a conductive metal nitride (e.g., titanium nitride, tantalum nitride, niobium nitride or tungsten nitride, etc.), a metal (e.g., ruthenium, iridium, titanium or tantalum, etc.), and a conductive metal oxide (e.g., iridium oxide, niobium oxide, etc.), the present disclosure is not limited thereto.

The second metal layer 382 may be formed on the pre-doping layer 390p. The second metal layer 382 may be formed along the profile of the pre-doping layer 390p. The second metal layer 382 may include, for example, a second metal having valence electrons of tetravalence or more. The second metal may include four or more valence electrons. Subsequently, an annealing process may be performed on the second metal layer 382. The annealing process may be performed, for example, within the temperature range of 200° C. to 700° C.

Referring to FIG. 14, by doping the second metal inside the pre doping layer 390p using the second metal layer 382 through the annealing process, the second doping layer 390 may be formed.

Referring to FIG. 11, the upper electrode 160 may be formed on the second metal layer 382. The upper electrode 160 may be formed to cover the side walls and the upper surface of the lower electrode 130. Further, the upper electrode 160 may be formed between the etching stop layer 120 and the first supporter pattern 141, and between the first supporter pattern 141 and the second supporter pattern 142.

Subsequently, by forming the second interlayer insulating film 170 on the upper electrode 160, the semiconductor device shown in FIG. 11 may be fabricated.

In some other embodiments, referring to FIG. 9, after the fabricating processes shown in FIGS. 4 to 8, 13 and 14 are performed, the second metal layer (382 of FIG. 14) may be removed. That is, after the second doping layer 290 is formed, the second metal layer (382 of FIG. 14) may be removed through the annealing process Subsequently, the upper electrode 160 may be formed on the second doping layer 290. The upper electrode 160 may be formed to cover the side wall and the upper surface of the lower electrode 130. Further, the upper electrode 160 may be formed between the etching stop layer 120 and the first supporter pattern 141, and between the first supporter pattern 141 and the second supporter pattern 142.

Subsequently, by forming the second interlayer insulating film 170 on the upper electrode 160, the semiconductor device shown in FIG. 9 may be fabricated.

A semiconductor device according to some other embodiments of the present disclosure will be described below referring to FIG. 15. Differences from the semiconductor devices shown in FIGS. 1 and 2 will be mainly described.

Figure 15:
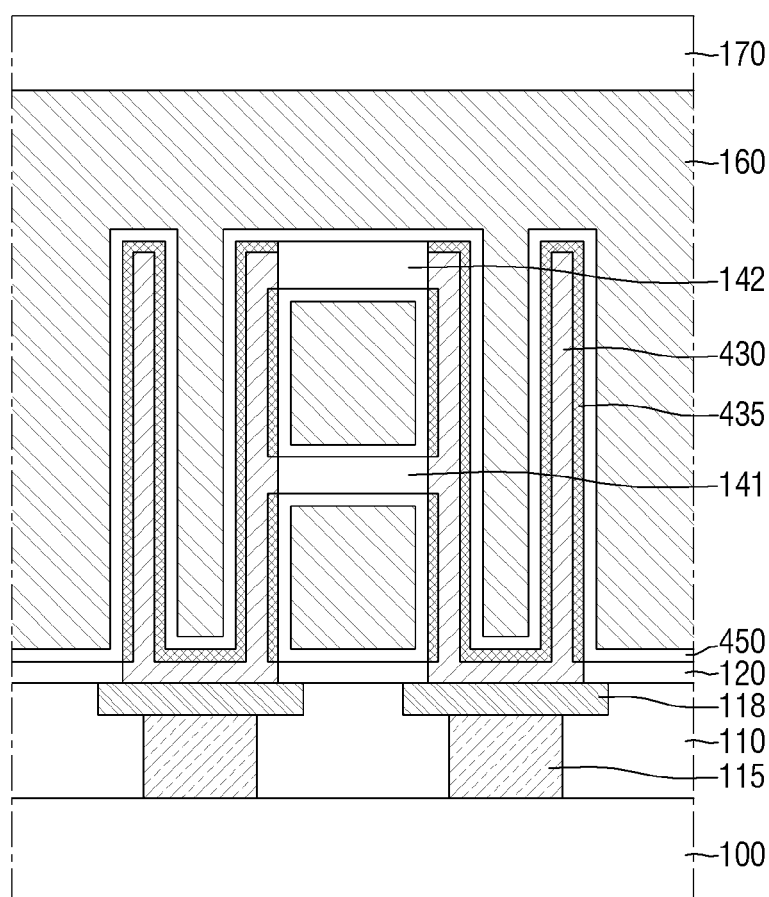
FIG. 15 is a diagram for explaining a semiconductor device according to some other embodiments of the present disclosure.

FIG. 15 is a diagram for explaining a semiconductor device according to some other embodiments of the present disclosure.

Referring to FIG. 15, in the semiconductor device according to some other embodiment of the present disclosure, a lower electrode 430 may have a cylinder shape. For example, the lower electrode 430 may have a cylindrical shape that has side walls and a bottom surface and has an empty interior. The side walls of the lower electrode 430 may extend in the vertical direction DR3.

The first doping layer 435 may be disposed on the lower electrode 430. The first doping layer 435 is not disposed between the lower electrode 430 and the etching stop layer 120, between the lower electrode 430 and the first supporter pattern 141, and between the lower electrode 430 and the second supporter patterns 142.

The capacitor dielectric film 450 may be disposed on the first doping layer 435. Further, the capacitor dielectric film 450 may be disposed along the upper surface of the etching stop layer 120, the upper surface and the lower surface of the first supporter pattern 141, and the upper surface and the lower surface of the second supporter pattern 142.

The upper electrode 160 may be disposed on the capacitor dielectric film 450. A part of the upper electrode 160 may fill a space between the side walls of the lower electrode 430 having a cylinder shape.

A semiconductor device according to some other embodiments of the present disclosure will be described below referring to FIG. 16. Differences from the semiconductor device shown in FIG. 15 will be mainly described.

Figure 16:
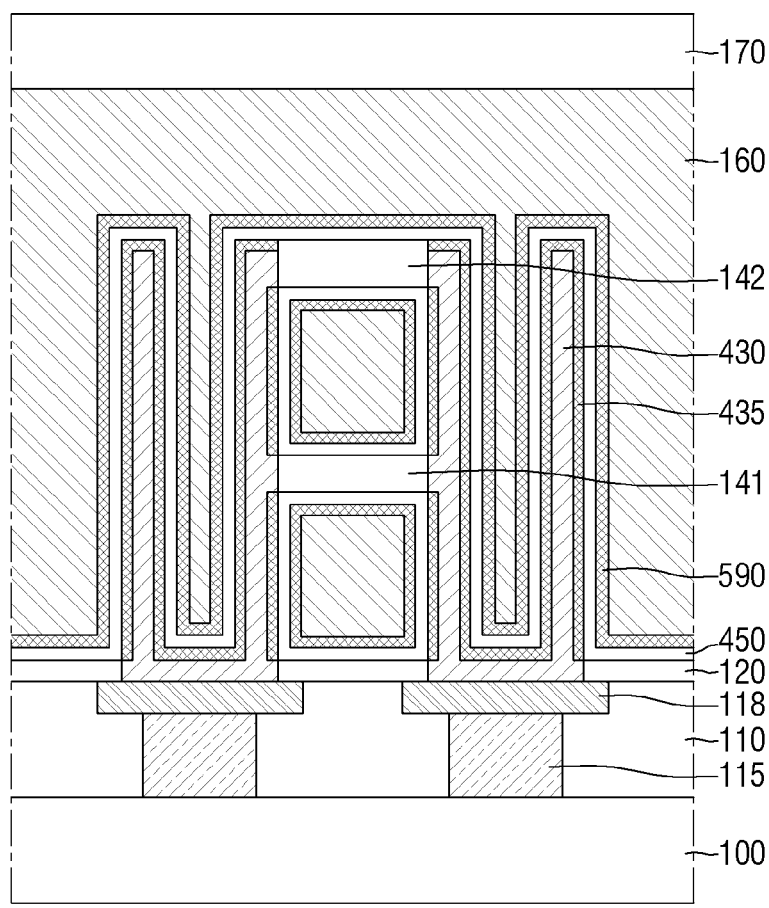
FIG. 16 is a diagram for explaining a semiconductor device according to some other embodiments of the present disclosure.
Figure 16:
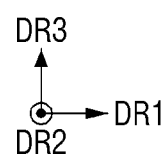

FIG. 16 is a diagram for explaining a semiconductor device according to some other embodiments of the present disclosure.

Referring to FIG. 16, the semiconductor device according to some other embodiment of the present disclosure may have a second doping layer 590 disposed between the capacitor dielectric film 450 and the upper electrode 160. The second doping layer 590 may be in contact with each of the capacitor dielectric film 450 and the upper electrode 160.

The second doping layer 590 may be disposed along the profile of the capacitor dielectric film 450. The second doping layer 590 may be doped with a second metal. The second metal doped in the second doping layer 590 may have valence electrons of tetravalence or more. The second metal may include four or more valence electrons. The second metal may include, for example, at least one of ruthenium (Ru), tungsten (W), molybdenum (Mo), vanadium (V), chromium (Cr), manganese (Mn), niobium (Nb), and tantalum (Ta). For example, the second doping layer 590 includes the second metal in an amount of 2 at % to 10 at %.

A semiconductor device according to some other embodiments of the present disclosure will be described below referring to FIG. 17. Differences from the semiconductor devices shown in FIGS. 1 and 2 will be mainly described.

Figure 17:
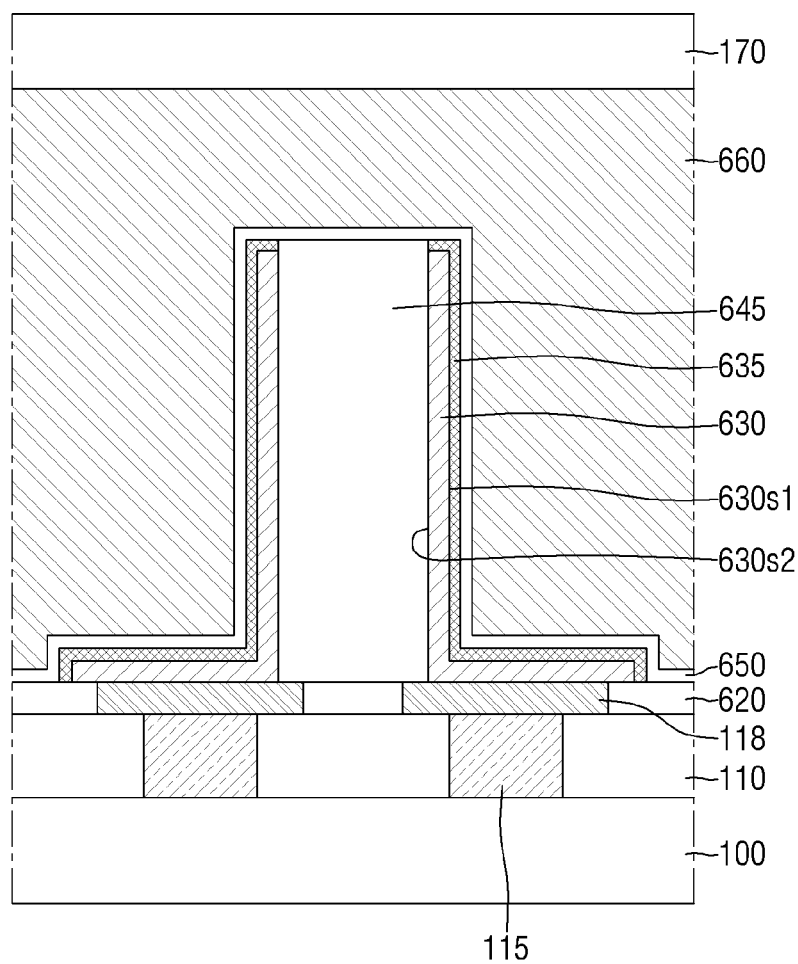
FIG. 17 is a diagram for explaining a semiconductor device according to some other embodiments of the present disclosure.
Figure 17:
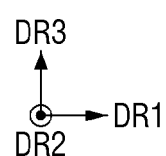

FIG. 17 is a diagram for explaining a semiconductor device according to some other embodiments of the present disclosure.

Referring to FIG. 17, the semiconductor device according to some other embodiment of the present disclosure may include an insulation pattern 645 disposed between the two lower electrodes 630. The insulation pattern 645 may extend in a second horizontal direction DR2 different from the first horizontal direction DR1.

The landing pad 118 may be disposed inside the etching stop layer 620. The lower electrode 630 may be disposed on the landing pad 118. The lower electrode 630 may have an L-shape. For example, the lower electrode 630 may include a first portion extending in the first horizontal direction DR1, and a second portion extending in the vertical direction DR3.

The first portion of the lower electrode 630 may be in contact with the landing pad 118. The second portion of the lower electrode 630 may be connected to one end of the first portion of the lower electrode 630. The second portion of the lower electrode 630 may include a first side wall 630s1, and a second side wall 630s2 opposite to the first side wall 630s1.

The insulation pattern 645 may be disposed on one side of the lower electrode 630. The insulation pattern 645 may be disposed on the second side wall 630s2 of the second portion of the lower electrode 630. For example, the insulation pattern 645 may be disposed between the second side walls 630s2 of the second portions of the two lower electrodes 630. The insulation pattern 645 may be in contact with the second side wall 630s2 of the second portion of the lower electrode 630.

The capacitor dielectric film 650 may be disposed on the etching stop layer 620, the lower electrode 630 and the insulation pattern 645. The capacitor dielectric film 650 may be in contact with each of the upper surface of the etching stop layer 620 and the upper surface of the insulation pattern 645. The capacitor dielectric film 650 is not disposed between the lower electrode 630 and the insulation pattern 645. Although not shown, the capacitor dielectric film 650 may be in contact with the side wall of the insulation pattern 645 in the second horizontal direction DR2.

The first doping layer 635 may be disposed between the lower electrode 630 and the capacitor dielectric film 650. For example, the first doping layer 635 may be disposed along the side wall and upper surface of the first portion of the lower electrode 630, and the first side wall 630s1 and upper surface of the second portion of the lower electrode 630.

The first doping layer 635 may be in contact with each of the lower electrode 630 and the capacitor dielectric film 650. The first doping layer 635 disposed on the uppermost surface of the lower electrode 630 may be in contact with the side wall of the insulation pattern 645. The first doping layer 635 is not disposed between the insulation pattern 645 and the capacitor dielectric film 650. For example, the uppermost surface of the first doping layer 635 may be formed on the same plane as the upper surface of the insulation pattern 645. However, the present disclosure is not limited thereto. The upper electrode 660 may be disposed on the capacitor dielectric film 650.

A semiconductor device according to some other embodiments of the present disclosure will be described below referring to FIG. 18. Differences from the semiconductor device shown in FIG. 17 will be mainly described.

Figure 18:
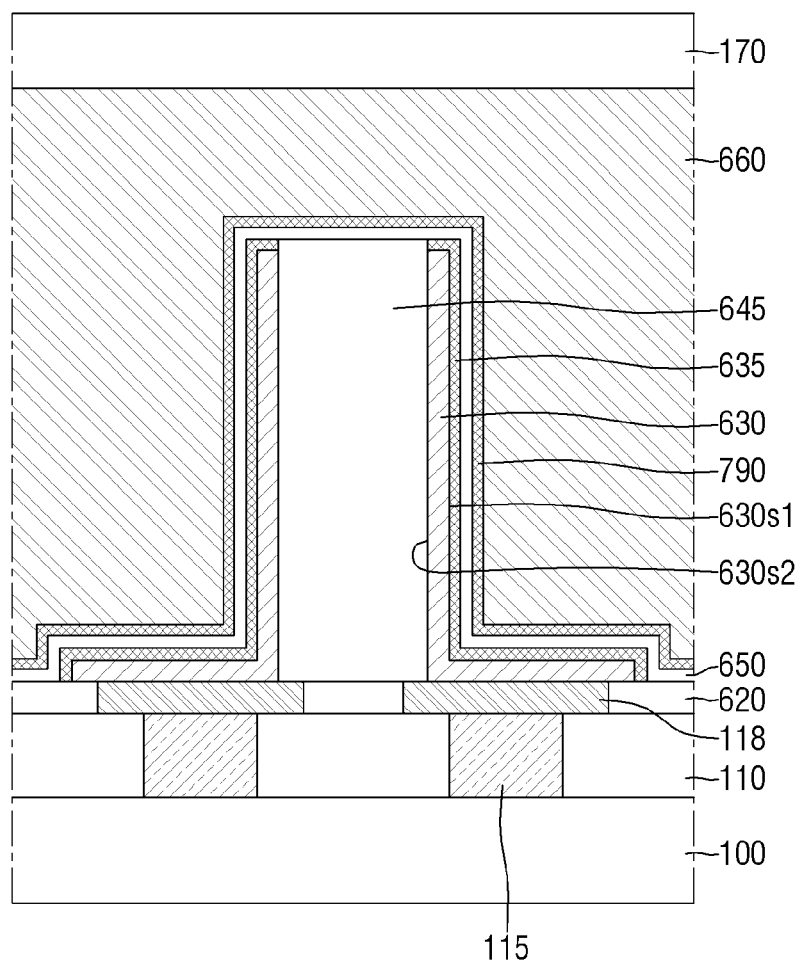
FIG. 18 is a diagram for explaining a semiconductor device according to some other embodiments of the present disclosure.

FIG. 18 is a diagram for explaining a semiconductor device according to some other embodiments of the present disclosure.

Referring to FIG. 18, the semiconductor device according to some other embodiment of the present disclosure may have a second doping layer 790 disposed between the capacitor dielectric film 650 and the upper electrode 660. The second doping layer 790 may be in contact with each of the capacitor dielectric film 650 and the upper electrode 660.

The second doping layer 790 may be disposed along the profile of the capacitor dielectric film 650. The second doping layer 790 may be doped with a second metal. The second metal doped in the second doping layer 690 may have valence electrons of tetravalence or more. The second metal may include four or more valence electrons. The second metal may include, for example, at least one of ruthenium (Ru), tungsten (W), molybdenum (Mo), vanadium (V), chromium (Cr), manganese (Mn), niobium (Nb), and tantalum (Ta). For example, the second doping layer 790 may include the second metal in an amount of 2 at % to 10 at %.

A semiconductor device according to some embodiments of the present disclosure will be described below referring to FIGS. 19 and 20.

Figure 19:
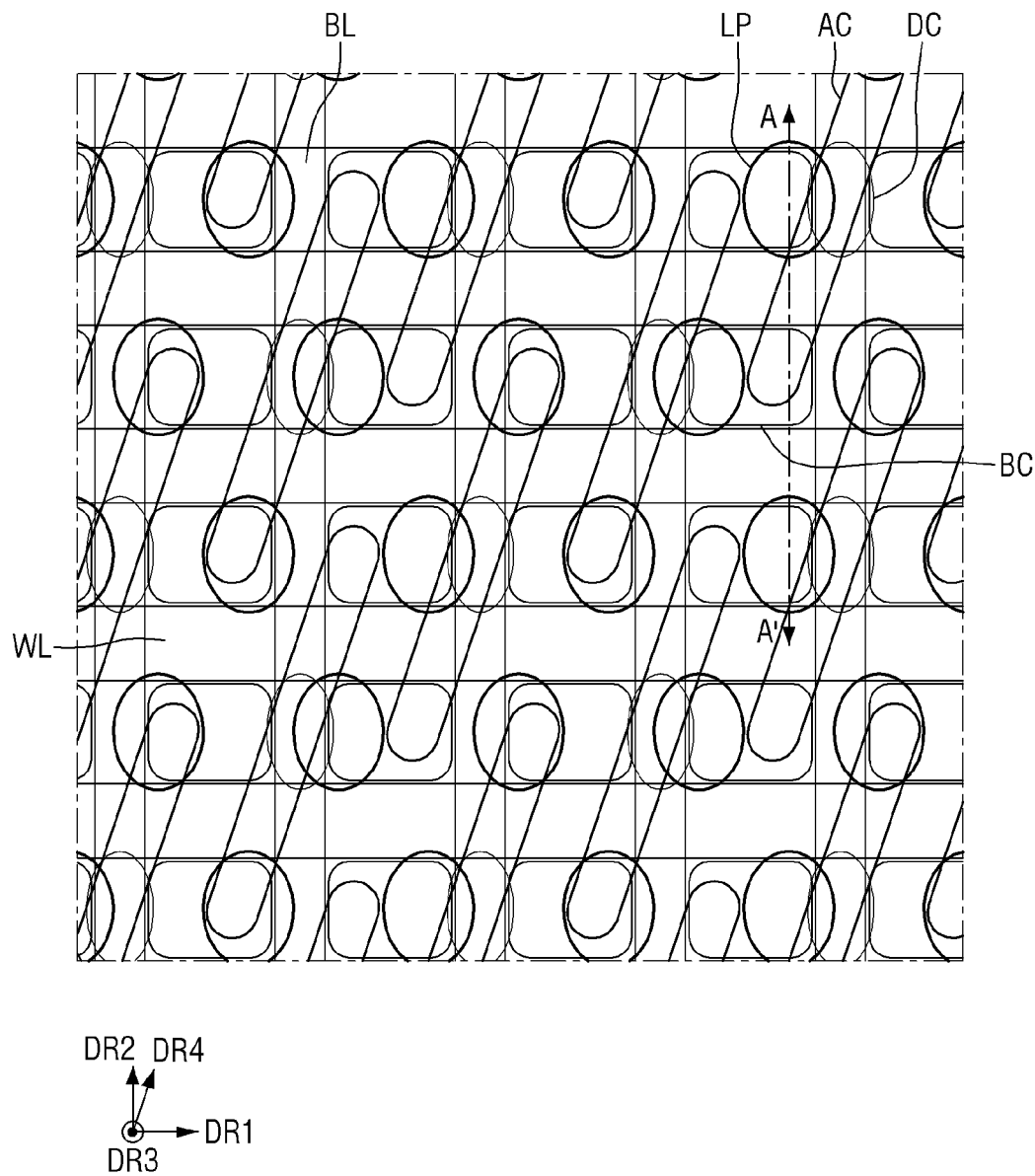
FIG. 19 is a layout diagram for explaining a semiconductor device according to some embodiments of the present disclosure.

FIG. 19 is a layout diagram for explaining a semiconductor device according to some embodiments of the present disclosure. FIG. 20 is a cross-sectional view taken along a line A-A' of FIG. 19. FIGS. 19 and 20 are diagrams showing the semiconductor device shown in FIG. 1 in detail.

Referring to FIG. 19, the semiconductor device according to some embodiments of the present disclosure may include a plurality of active regions AC. The active region AC may be defined by an element separation film (805 of FIG. 20) disposed inside the substrate (100 of FIG. 20).

As design rules of the semiconductor device decrease, the active region AC may be disposed in the form of a bar of a diagonal line or oblique line, as shown in FIG. 19. The active region AC may have the form of a bar extending in the third horizontal direction DR4.

A plurality of gate electrodes may be disposed on the active region AC in the first horizontal direction DR1 across the active region AC. The plurality of gate electrodes may extend parallel to each other. The plurality of gate electrodes may be, for example, a plurality of word lines WL. The word lines WL may be disposed at equal intervals. A width of the word line WL or an interval between the word lines WL may be determined depending on the design rules.

A plurality of bit lines BL extending in the second horizontal direction DR2 may be disposed on the word line WL. The plurality of bit lines BL may extend parallel to each other. The bit lines BL may be disposed at equal intervals. A width of the bit line BL or an interval between the bit lines BL may be determined depending on the design rules.

The semiconductor device according to some embodiments of the present disclosure may include various contact arrangements disposed on the active region AC. Various contact arrangements may include, for example, a direct contact DC, a buried contact BC, and a landing pad LP. Here, the direct contact DC may mean a contact that electrically connects the active region AC to the bit line BL. The buried contact BC may mean a contact that electrically connects the active region AC to the lower electrode (130 of FIG. 20) of the capacitor. Due to its layout, a contact area between the buried contact BC and the active region AC may be small. Accordingly, a conductive landing pad LP may be disposed to enlarge the contact area with the active region AC and enlarge the contact area with the lower electrode (130 of FIG. 20) of the capacitor.

The landing pad LP may be disposed between the active region AC and the buried contact BC, and may be disposed between the buried contact BC and the lower electrode (130 of FIG. 20) of the capacitor. The landing pad LP may be disposed between the buried contact BC and the lower electrode (130 of FIG. 20) of the capacitor. By enlarging the contact area through introduction of the landing pad LP, the contact resistance between the active region AC and the lower electrode (130 of FIG. 20) of the capacitor may be reduced.

The direct contact DC may be disposed in a central portion of the active region AC. The buried contact BC may be disposed at both end portions of the active region AC. By disposing the buried contact BC at both end portions of the active region AC, the landing pad LP may be disposed to partially overlap the buried contact BC to be adjacent to both ends of the active region AC. In other words, the buried contact BC may be disposed to overlap the active region AC and the element separation film (805 of FIG. 20) between adjacent word lines WL and between adjacent bit lines BL.

Figure 20:
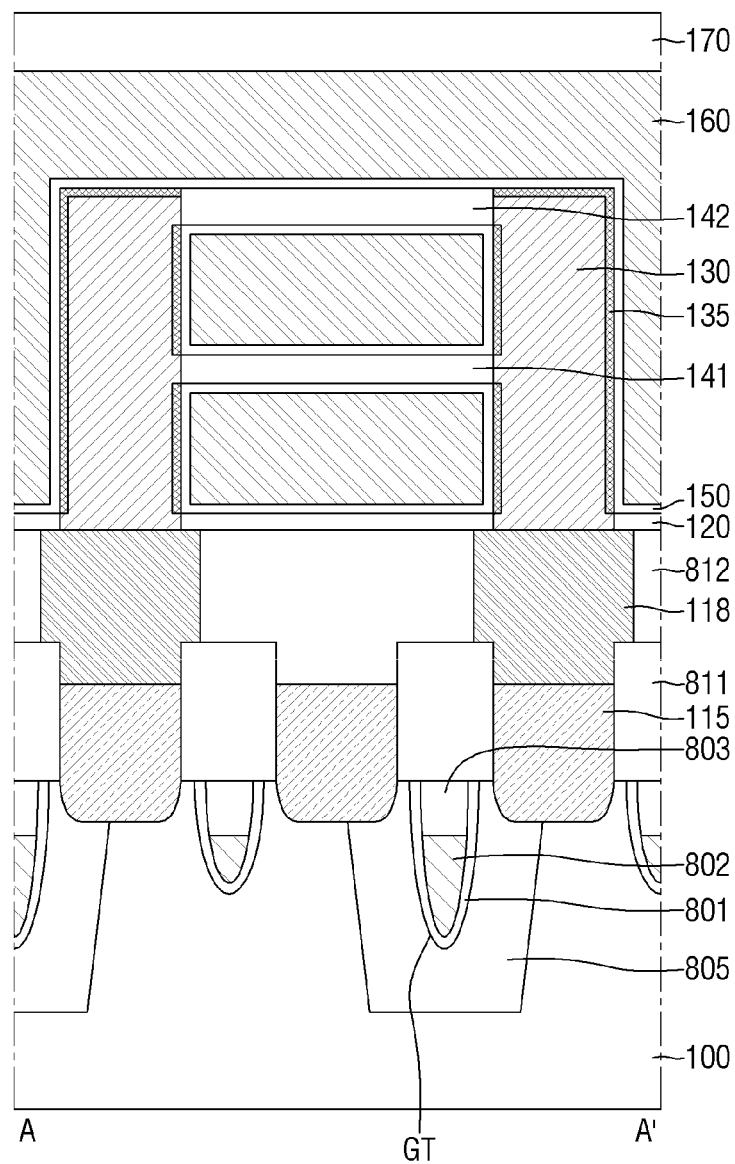
FIG. 20 is a cross-sectional view taken along a line A-A' of FIG. 19.

The word line WL may be disposed as a structure buried inside the substrate (100 of FIG. 20). The word line WL may be disposed across the active region AC between the direct contact DC and the buried contact BC. As shown in FIG. 19, two word lines WL may be disposed to cross the single active region AC. Since the active region AC is disposed diagonally, the word line WL may have an angle of less than 90 degrees with the active region AC. The direct contact DC and the buried contact BC may be disposed symmetrically. Therefore, the direct contact DC and the buried contact BC may be disposed on a straight line along the first horizontal direction DR1 and the second horizontal direction DR2.

On the other hand, unlike the direct contact DC and the buried contact BC, the landing pad LP may be disposed in a zigzag manner in the second horizontal direction DR2 along which the bit line BL extends. Also, the landing pad LP may be disposed to overlap the same side surface portion of each bit line BL in the first horizontal direction DR1 along which the word line WL extends. For example, each of the landing pads LP of the first line may overlap a left side surface of the corresponding bit line BL, and each of the landing pads LP of the second line may overlap a right side surface of the corresponding bit line BL.

Referring to FIGS. 19 and 20, the semiconductor device according to some embodiments of the present disclosure may include a substrate 100, gate structures 801, 802, and 803, an element separation film 805, a storage contact 115, a landing pad 118, a lower interlayer insulating film 811, an upper interlayer insulating film 812, an etching stop layer 120, a lower electrode 130, a first doping layer 135, a first supporter pattern 141, a second supporter pattern 142, a capacitor dielectric film 150, an upper electrode 160, and a second interlayer insulating film 170.

The element separation film 805 may be disposed inside the substrate 100. The element separation film 805 may have an STI (shallow trench isolation) structure having excellent element separation characteristics. The element separation film 805 may define an active region AC on the substrate 100. The active region AC defined by the element separation film 805 may have a long island shape including a major axis and a minor axis as shown in FIG. 19.

The active region AC may have an oblique shape to have an angle of less than 90 degrees with respect to the word line WL disposed inside the element separation film 805. Further, the active region AC may have an oblique line to have an angle of less than 90 degrees with respect to the bit line BL disposed on the element separation film 805. That is, the active region AC may extend longitudinally in a third horizontal direction DR4 having a predetermined angle with respect to the first horizontal direction DR1 and the second horizontal direction DR2.

The gate structures 801, 802, and 803 may be disposed inside the substrate 100 and the element separation film 805. The gate structures 801, 802, and 803 may be disposed across the element separation film 805 and the active region AC defined by the element separation film 805. The gate structures 801, 802, and 803 may be disposed inside the active region AC of the substrate 100 and inside the element separation film 805, respectively.

The gate structures 801, 802, and 803 may be disposed in a trench GT formed inside the substrate 100 and the element separation film 805. The gate structures 801, 802, and 803 may include a gate insulating film 801, a gate electrode 802 and a capping pattern 803. The gate electrode 802 may correspond to the word line WL.

For example, a depth of the trench GT formed on the substrate 100 may differ from a depth of the trench GT formed on the element separation film 805. The gate insulating film 801 may be disposed along the side wall and bottom surface of the trench GT. The gate insulating film 801 may be disposed along the profile of at least a part of the trench GT. The gate insulating film 801 may include, for example, at least one of silicon oxide, silicon oxynitride, silicon nitride, or a high dielectric constant material having a higher dielectric constant than silicon dioxide.

The gate electrode 802 may be disposed on the gate insulating film 801. The gate electrode 802 may fill a part of the trench GT. The gate electrode 802 may include at least one of an impurity-doped semiconductor material, a conductive silicide compound, a conductive metal nitride, a conductive metal oxide, a conductive metal oxynitride and a metal.

The capping pattern 803 may be disposed on the gate electrode 802. The capping pattern 803 may fill the rest of the trench GT in which the gate electrode 802 is formed. The capping pattern 803 may include, for example, at least one of silicon nitride (SiN), silicon oxynitride (SiON), silicon oxide (Sift), silicon carbonitride (SiCN), silicon oxycarbonitride (SiOCN), and combinations thereof.

The lower interlayer insulating film 811 may be disposed on the substrate 100 and the element separation film 805. The lower interlayer insulating film 811 may cover the gate structures 801, 802, and 803. The upper interlayer insulating film 812 may be disposed on the lower interlayer insulating film 811. The upper interlayer insulating film 812 may surround the landing pad 118. The upper interlayer insulating film 812 and the lower interlayer insulating film 811 may correspond to the first interlayer insulating film 110 shown in FIG. 1.

The storage contact 115 may be disposed inside the lower interlayer insulating film 811. The storage contact 115 may be connected to the substrate 100. Specifically, the storage contact 115 may be connected to a source/drain region formed in the active region AC of the substrate 100. The storage contact 115 may be disposed on at least one side of the gate structures 801, 802, and 803. For example, the storage contacts 115 may be disposed on both sides of the gate structures 801, 802, and 803. The storage contact 115 may correspond to the buried contact BC.

The landing pad 118 may be disposed on the storage contact 115. The landing pad 118 may be electrically connected to the storage contact 115. The etching stop layer 120 may be disposed on the upper interlayer insulating film 812 and the landing pad 118.

Each of the lower electrode 130, the first doping layer 135, the first supporter pattern 141, the second supporter pattern 142, the capacitor dielectric film 150, the upper electrode 160 and the second interlayer insulating films 170 shown in FIG. 20 may be substantially the same as each of the lower electrode 130, the first doping layer 135, the first supporter pattern 141, the second supporter pattern 142, the capacitor dielectric film 150, the upper electrode 160 and the second interlayer insulating film 170 shown in FIG. 1.

A semiconductor device according to some other embodiments of the present disclosure will be described below referring to FIGS. 21 to 23.

Figure 21:
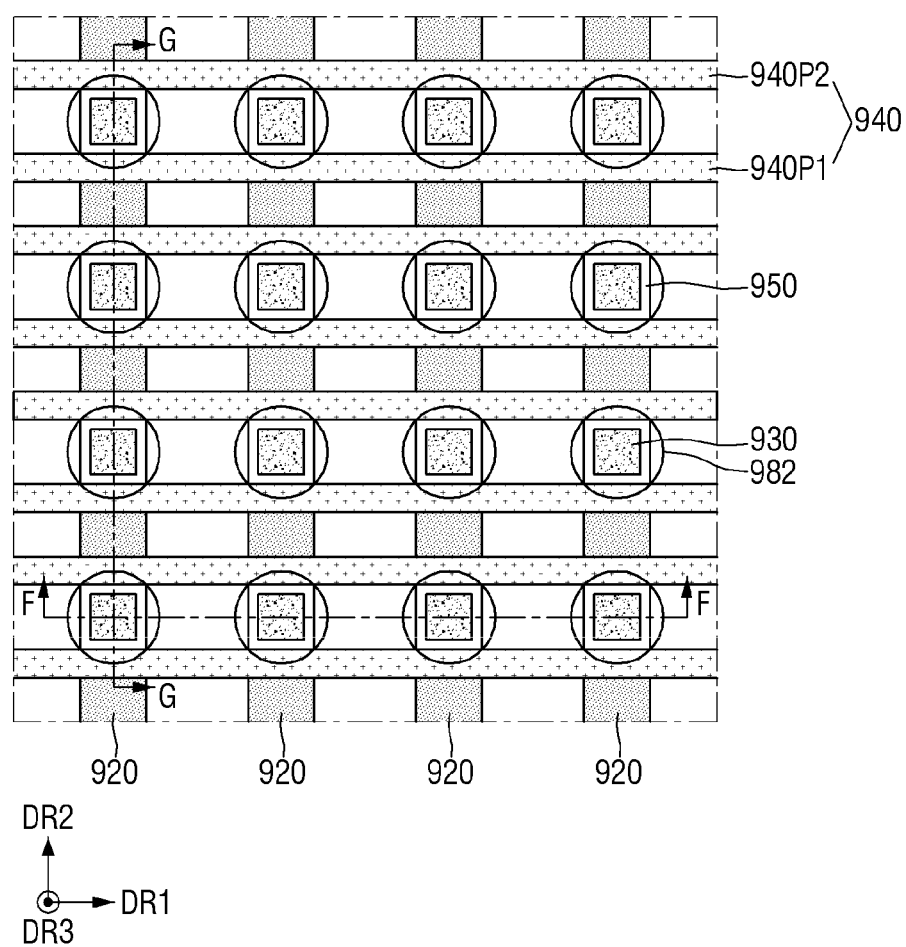
FIG. 21 is a layout diagram for explaining a semiconductor device according to some other embodiment of the present disclosure.

FIG. 21 is a layout diagram for explaining a semiconductor device according to some other embodiment of the present disclosure. FIG. 22 is a perspective view for explaining a semiconductor device according to some other embodiment of the present disclosure. FIG. 23 is a cross-sectional view taken along lines F-F and G-G of FIG. 21.

Figure 22:
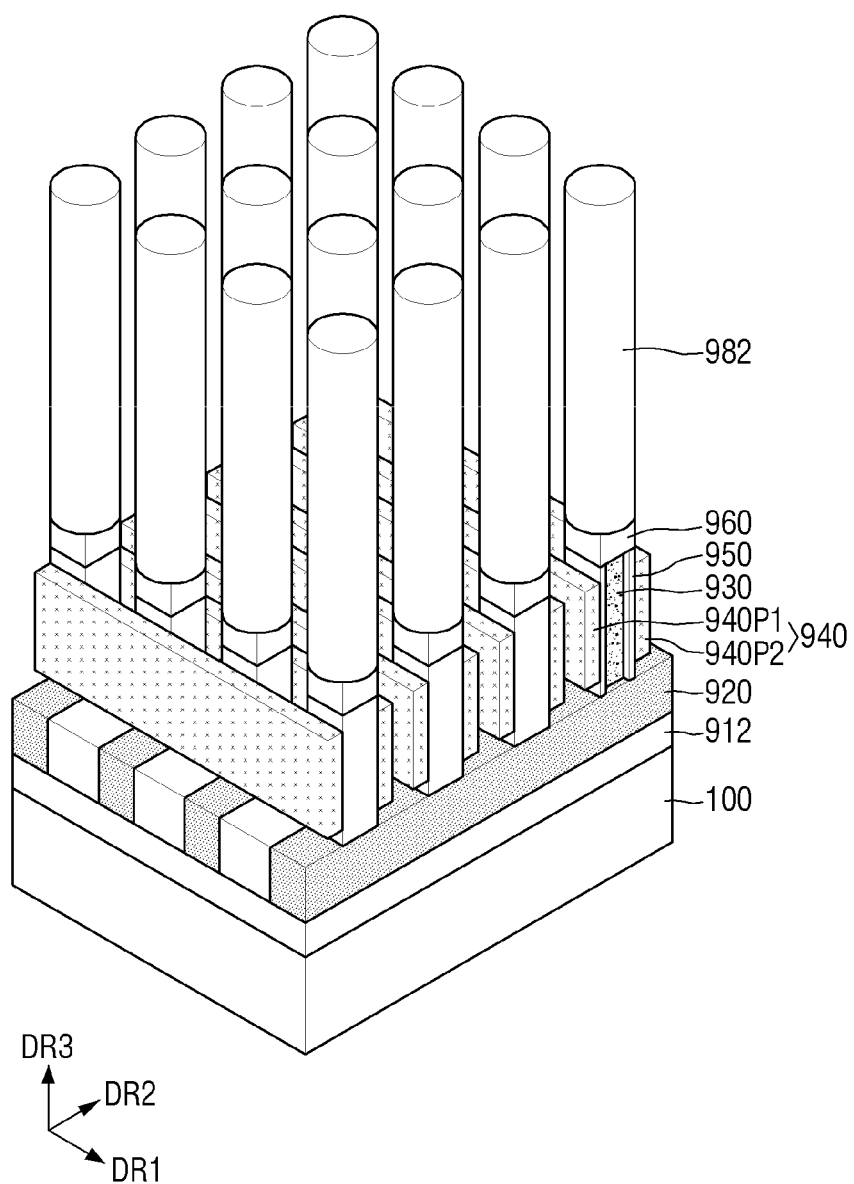
FIG. 22 is a perspective view for explaining a semiconductor device according to some other embodiment of the present disclosure.
Figure 23:
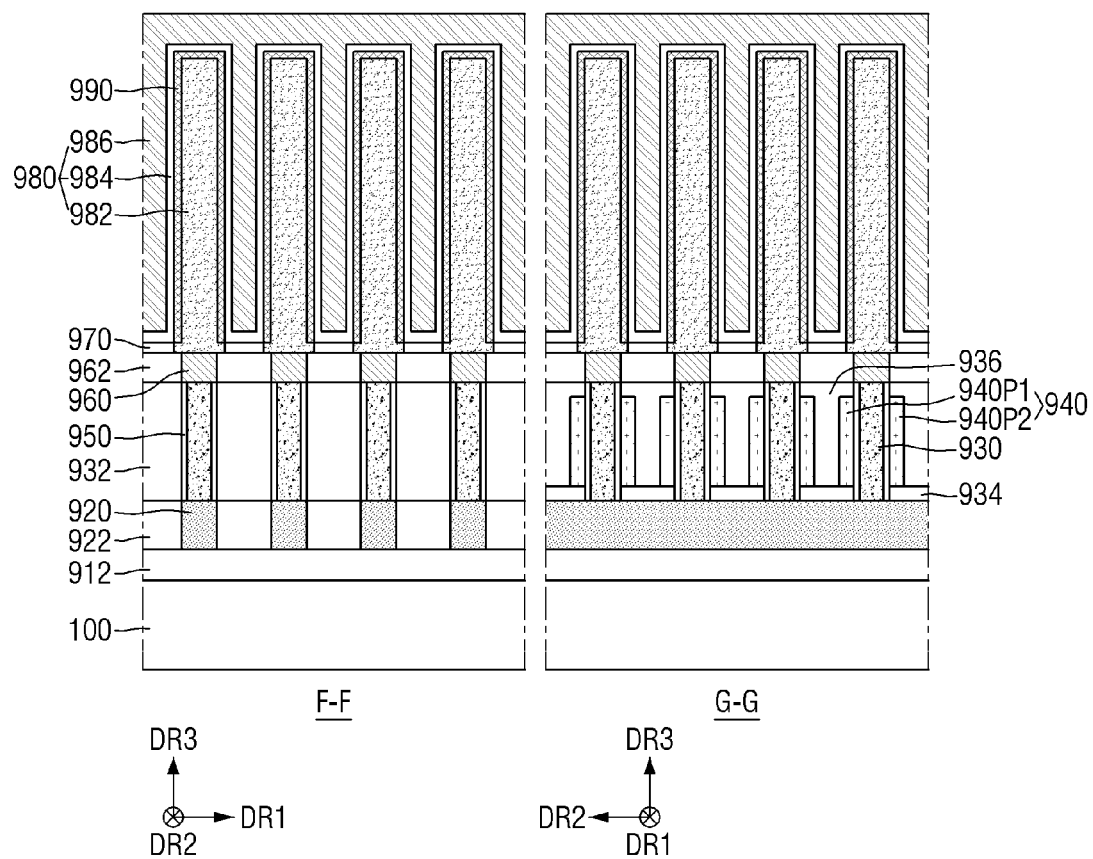
FIG. 23 is a cross-sectional view taken along lines F-F and G-G of FIG. 21.

Referring to FIGS. 21 to 23, the semiconductor device according to some other embodiment of the present disclosure may include a substrate 100, a plurality of first conductive lines 920, a channel layer 930, a gate electrode 940, a gate insulating film 950, and a capacitor 980. The semiconductor device according to some other embodiments of the present disclosure may include a vertical channel transistor (VCT). The vertical channel transistor may refer to a structure in which a channel length of the channel layer 930 extends from the substrate 100 along the vertical direction DR3.

A lower insulating layer 912 may be disposed on the substrate 100. On the lower insulating layer 912, a plurality of first conductive lines 920 are spaced apart from each other in the first horizontal direction DR1 and may extend in the second horizontal direction DR2. A plurality of first insulation patterns 922 may be disposed on the lower insulating layer 912 to fill the space between the plurality of first conductive lines 920. The plurality of first insulation patterns 922 may extend in the second horizontal direction DR2. The upper surface of the plurality of first insulating patterns 922 may be disposed at the same level as the upper surface of the plurality of first conductive lines 920. The plurality of first conductive lines 920 may function as bit lines.

The plurality of first conductive lines 920 may include a doped semiconductor material, a metal, a conductive metal nitride, a conductive metal silicide, a conductive metal oxide, or a combination thereof. For example, the plurality of first conductive lines 920 may be made up of, but are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or a combination thereof. The plurality of first conductive lines 920 may include a single layer or multi-layers of the above-mentioned materials. In some embodiments, the plurality of first conductive lines 920 may include graphene, carbon nanotube or a combination thereof.

The channel layers 930 may be disposed in a matrix form that is disposed on a plurality of first conductive lines 920 to be spaced apart from each other in the first horizontal direction DR1 and the second horizontal direction DR2. The channel layer 930 may have a first width along the first horizontal direction DR1 and a first height along the vertical direction DR3, and the first height may be greater than the first width. Here, the vertical direction DR3 may intersect the first horizontal direction DR1 and the second horizontal direction DR2, and may be, for example, a direction perpendicular to the upper surface of the substrate 100. For example, although the first height may be about 2 to 10 times the first width, the present disclosure is not limited thereto. A bottom portion of the channel layer 930 may function as a first source/drain region (not shown), an upper portion of the channel layer 930 may function as a second source/drain region (not shown), and a part of the channel layer 930 between the first and second source/drain regions may function as a channel region (not shown).

In some embodiments, the channel layer 930 may include an oxide semiconductor, and the oxide semiconductor may include, for example, InxGayZnzO, InxGaySizO, InxSnyZnzO, InxZnyO, ZnxO, ZnxSnyO, ZnxOyN, ZrxZnySnzO, SnxO, HfxInyZnz, GaxZnySnzO, AlxZnySnzO, YbxGayZnzO, InxGayO or a combination thereof. The channel layer 930 may include a single layer or multi-layers of the aforementioned oxide semiconductor. In some embodiments, the channel layer 930 may have bandgap energy that is greater than bandgap energy of silicon. For example, the channel layer 930 may have bandgap energy of about 1.5 eV to 5.6 eV. For example, the channel layer 930 may have optimum channel performance when having the bandgap energy of about 2.0 eV to 4.0 eV. For example, the channel layer 930 may be, but is not limited to, polycrystalline or amorphous. In some embodiments, the channel layer 930 may include graphene, carbon nanotube or a combination thereof.

The gate electrode 940 may extend in the first horizontal direction DR1 on both side walls of the channel layer 930. The gate electrode 940 may include a first subgate electrode 940P1 facing the first side wall of the channel layer 930, and a second subgate electrode 940P2 facing the second side wall opposite to the first side wall of the channel layer 930. Since the single channel layer 930 is disposed between the first subgate electrode 940P1 and the second subgate electrode 940P2, the semiconductor device may have a dual gate transistor structure. However, the present disclosure is not limited thereto. The second subgate electrode 940P2 is omitted, only the first subgate electrode 940P1 facing the first side wall of the channel layer 930 is formed, and a single gate transistor structure may be implemented. The material included in the gate electrode 940 may be the same as description of the gate electrode (802 of FIG. 20).

The gate insulating film 950 surrounds the side walls of the channel layer 930, and may be interposed between the channel layer 930 and the gate electrode 940. For example, as shown in FIG. 21, the entire side walls of the channel layer 930 may be surrounded by the gate insulating film 950, and a part of the side walls of the gate electrode 940 may be in contact with the gate insulating film 950. In some other embodiments, the gate insulating film 950 may extend in an extension direction (i.e., the first horizontal direction DR1) of the gate electrode 940, and among the side walls of the channel layer 930, only the two side walls facing the gate electrode 940 may be in contact with the gate insulating film 950. In some embodiments, the gate insulating film 950 may be made up of a silicon oxide film, a silicon oxynitride film, a high dielectric constant material having a higher dielectric constant than the silicon dioxide film, or a combination thereof.

A plurality of second insulation patterns 932 may extend along the second horizontal direction DR2 on the plurality of first insulation patterns 922. A channel layer 930 may be disposed between two adjacent second insulation patterns 932 among the plurality of second insulation patterns 932. Further, between the two adjacent second insulation patterns 932, a first buried layer 934 and a second buried layer 936 may be disposed in the space between the two adjacent channel layers 930. The first buried layer 934 may be located at the bottom portion of the space between the two adjacent channel layers 930. The second buried layer 936 may be formed on the first buried layer 934 to fill the rest of the space between the two adjacent channel layers 930. An upper surface of the second buried layer 936 is disposed at the same level as the upper surface of the channel layer 930, and the second buried layer 936 may cover the upper surface of the gate electrode 940. In contrast, a plurality of second insulation patterns 932 may be formed of a material layer which is continuous with a plurality of first insulation patterns 922, or the second buried layer 936 may be formed of a material layer which is continuous with the first buried layer 934. In some embodiments, the plurality of second insulation patterns 932 and the plurality of first insulation patterns 922 may include the same material or the second buried layer 936 and the first buried layer 934 may include the same material.

A capacitor contact 960 may be disposed on the channel layer 930. The capacitor contact 960 is disposed to overlap the channel layer 930 in the vertical direction DR3, and may be arranged in a matrix form that is disposed to be spaced apart from each other in the first horizontal direction DR1 and the second horizontal direction DR2. Although the capacitor contact 960 may be made up of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or a combination thereof, the present disclosure is not limited thereto. The upper insulating layer 962 may surround the side walls of the capacitor contact 960 on the plurality of second insulation patterns 932 and the second buried layer 936.

An etching stop layer 970 may be disposed on the upper insulating layer 962. A capacitor 980 may be disposed on the etching stop layer 970. The capacitor 980 may include a lower electrode 982, a doping layer 990, a capacitor dielectric film 984, and an upper electrode 986. The lower electrode 982 may penetrate the etching stop layer 970 and be electrically connected to the upper surface of the capacitor contact 960. Although the lower electrode 982 may be formed in a pillar type extending in the vertical direction DR3, the present disclosure is not limited thereto. In some embodiments, the lower electrode 982 is disposed to overlap the capacitor contact 960 in the vertical direction DR3, and may be arranged in a matrix form that is disposed to be spaced apart from each other in the first horizontal direction DR1 and the second horizontal direction DR2. In some embodiments, a landing pad (not shown) may be further disposed between the capacitor contact 960 and the lower electrode 982, and the lower electrode 982 may be arranged in a hexagonal shape.

The doping layer 990 may be disposed between the lower electrode 982 and the capacitor dielectric film 984. The doping layer 990 may include a doped metal. The metal doped in the doping layer 990 may have valence electrons of tetravalence or more. The metal may include four or more valence electrons. The metal may include, for example, at least one of ruthenium (Ru), tungsten (W), molybdenum (Mo), vanadium (V), chromium (Cr), manganese (Mn), niobium (Nb), and tantalum (Ta). For example, the doping layer 990 may include the metal in an amount of 2 at % to 10 at %.

The capacitor dielectric film 984 may include both a tetragonal crystal system and an orthorhombic crystal system.

Hereinafter, a semiconductor device according to some other embodiments of the present disclosure will be described referring to FIGS. 24 and 25.

Figure 24:
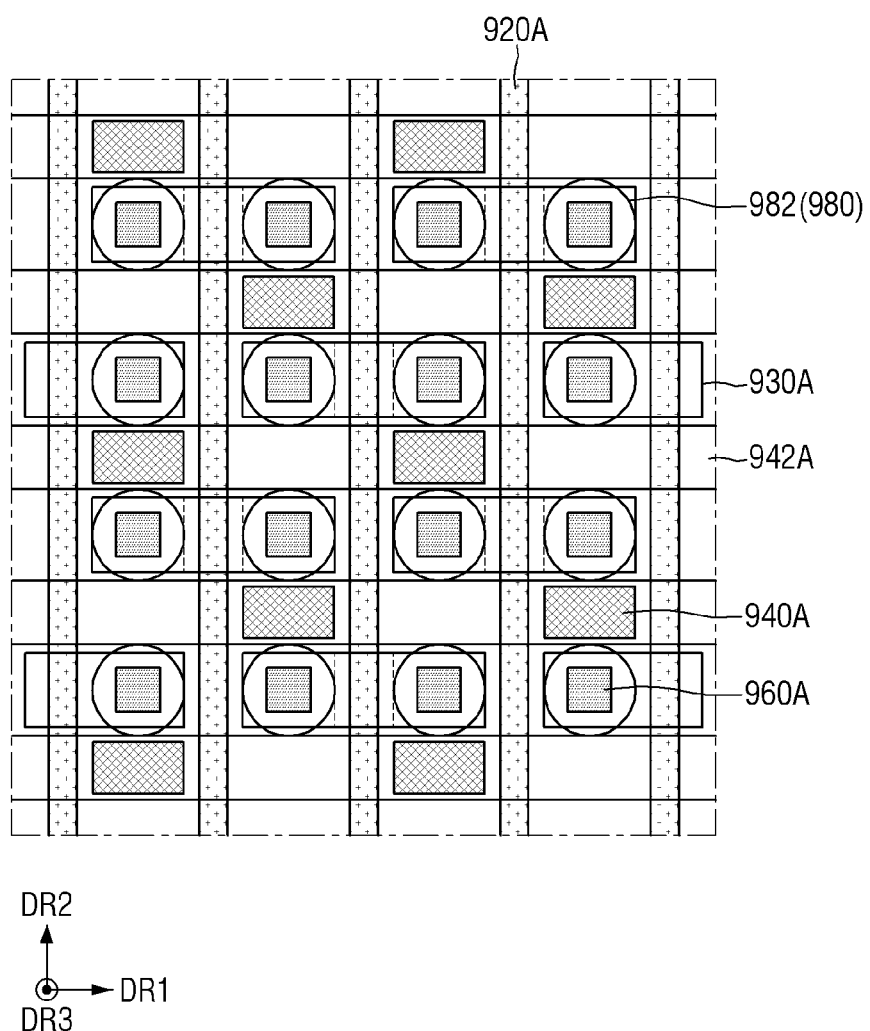
FIG. 24 is a layout diagram for explaining a semiconductor device according to some other embodiment of the present disclosure.

FIG. 24 is a layout diagram for explaining a semiconductor device according to some other embodiment of the present disclosure. FIG. 25 is a perspective view for explaining a semiconductor device according to some other embodiment of the present disclosure.

Figure 25:
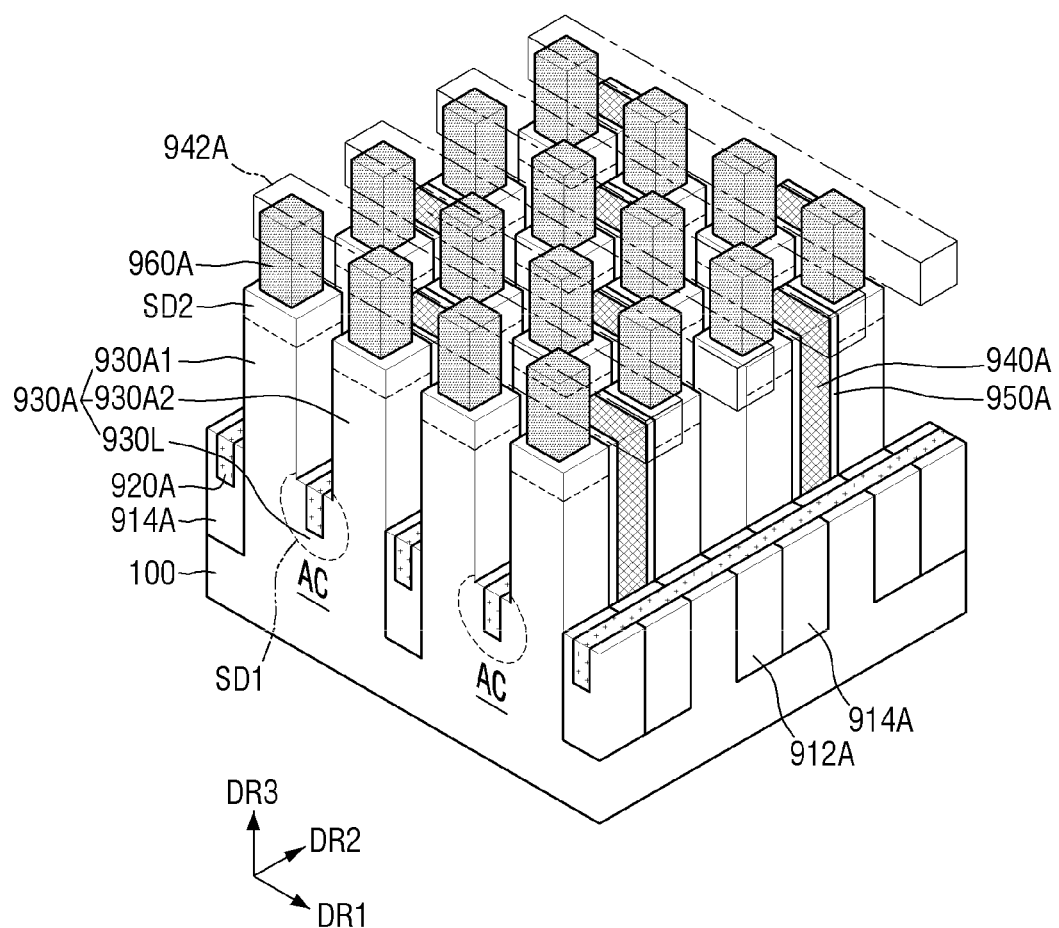
FIG. 25 is a perspective view for explaining a semiconductor device according to some other embodiment of the present disclosure.

Referring to FIGS. 24 and 25, a semiconductor device according to some other embodiments of the present disclosure may include a substrate 100, a plurality of first conductive lines 920A, a channel structure 930A, a contact gate electrode 940A, a plurality of second conductive lines 942A, and a capacitor 980. The semiconductor device according to some other embodiments of the present disclosure may include a vertical channel transistor VCT.

A plurality of active regions AC may be defined in the substrate 100 by the first element separation pattern 912A and the second element separation pattern 914A. The channel structure 930A may be disposed inside each of the plurality of active regions AC. The channel structure 930A may include a first active pillar 930A1 and a second active pillar 930A2 each extending in the vertical direction DR3, and a connecting portion 930L connected to the bottom portion of the first active pillar 930A1 and the bottom portion of the second active pillar 930A2. A first source/drain region SD1 may be disposed inside the connecting portion 930L. A second source/drain region SD2 may be disposed on the upper sides of the first and second active pillars 930A1 and 930A2. The first active pillar 930A1 and the second active pillar 930A2 may each form an independent unit memory cell.

The plurality of first conductive lines 920A may extend in a direction intersecting each of the plurality of active regions AC, and may extend, for example, in the second horizontal direction DR2. One first conductive line 920A of the plurality of first conductive lines 920A may be disposed on the connecting portion 930L between the first active pillar 930A1 and the second active pillar 930A2. One first conductive line 920A may be disposed on the first source/drain region SD1. The other first conductive line 920A adjacent to one first conductive line 920A may be disposed between the two channel structures 930A. One first conductive line 920A of the plurality of first conductive lines 920A may function as a common bit line included in two unit memory cells which are formed by the first active pillar 930A1 and the second active pillar 930A2 disposed on both sides of one first conductive line 920A.

One contact gate electrode 940A may be disposed between the two channel structures 930A adjacent to each other in the second horizontal direction DR2. For example, a contact gate electrode 940A may be disposed between the first active pillar 930A1 included in one channel structure 930A and the second active pillar 930A2 of the channel structure 930A adjacent thereto. One contact gate electrode 940A may be shared by the first active pillar 930A1 and the second active pillar 930A2 disposed on both side walls thereof. A gate insulating film 950A may be disposed between the contact gate electrode 940A and the first active pillar 930A1, and between the contact gate electrode 940A and the second active pillar 930A2. The plurality of second conductive lines 942A may extend in the first horizontal direction DR1 on the upper surface of the contact gate electrode 940A. The plurality of second conductive lines 942A may function as a word line of the semiconductor device.

A capacitor contact 960A may be disposed on the channel structure 930A. The capacitor contact 960A may be disposed on the second source/drain region SD2, and the capacitor 980 may be disposed on the capacitor contact 960A. The capacitor 980 may include a lower electrode 982, a doping layer 990, a capacitor dielectric film 984, and an upper electrode 986 shown in FIG. 23.

In concluding the detailed description, those skilled in the art will appreciate that many variations and modifications may be made to the embodiments described herein without substantially departing from the scope of the present disclosure. Therefore, the disclosed embodiments of the disclosure are used in a generic and descriptive sense only and not for purposes of limitation.

What is claimed is:
1. A semiconductor device comprising:
a landing pad on a substrate;

a lower electrode on the landing pad and electrically connected to the landing pad;

a capacitor dielectric film that is on the lower electrode and includes both a tetragonal crystal system and an orthorhombic crystal system;

a first doping layer that is between the lower electrode and the capacitor dielectric film and includes a first metal, the first doping layer physically contacting the lower electrode;

an upper electrode on the capacitor dielectric film;

a supporter pattern that is on at least one side of the lower electrode, wherein side walls of the supporter pattern are in direct contact with side walls of the lower electrode and a part of the first doping layer, and wherein an uppermost surface of the supporter pattern is in direct contact with the capacitor dielectric film;

wherein the first doping layer includes the first metal in an amount of 2 at % to 10 at %; and wherein an uppermost surface of the first doping layer and the uppermost surface of the supporter pattern are coplanar.

2. The semiconductor device of claim 1, wherein the first metal has four or more valence electrons.

3. The semiconductor device of claim 1, wherein the first doping layer has a thickness of 5 Å to 10 Å.

4. The semiconductor device of claim 1, further comprising:
a second doping layer that is between the capacitor dielectric film and the upper electrode and includes a second metal.

5. The semiconductor device of claim 4, wherein the second metal has four or more valence electrons, and the second doping layer includes the second metal in an amount of 2 at % to 10 at %.

6. The semiconductor device of claim 4, further comprising:
a metal layer that is between the second doping layer and the upper electrode and includes the second metal.

7. The semiconductor device of claim 1, wherein the first metal is a dopant, and when the first doping layer comprises a metal oxide including a second metal, the first metal has four or more valence electrons.

8. The semiconductor device of claim 1, the capacitor dielectric film is a single layer.

9. A semiconductor device comprising:
a capacitor comprising:
a first electrode and a second electrode;
a capacitor dielectric film extending between the first electrode and the second electrode and including both a tetragonal crystal system and an orthorhombic crystal system;
a first doping layer that is between the first electrode and the capacitor dielectric film and includes a first metal as a dopant, the first metal having four or more valence electrons;
a supporter pattern that is on at least one side of the lower electrode, wherein side walls of the supporter pattern are in direct contact with side walls of the lower electrode and a part of the first doping layer, and wherein an uppermost surface of the supporter pattern is in direct contact with the capacitor dielectric film;

wherein the first doping layer includes the first metal in an amount of 2 at % to 10 at %; and wherein an uppermost surface of the first doping layer and the uppermost surface of the supporter pattern are coplanar.

10. The semiconductor device of claim 9, wherein the first electrode and the first doping layer include the same material.

11. The semiconductor device of claim 9, wherein the first doping layer includes the first metal in an amount of 2 at % to 10 at %.

12. The semiconductor device of claim 9, further comprising a second doping layer that is between the second electrode and the capacitor dielectric film and includes a second metal having four or more valence electrons.

13. A semiconductor device comprising:
a landing pad on a substrate;
a lower electrode on the landing pad and electrically connected to the landing pad;
an upper electrode on the lower electrode;
a dielectric film that is between the lower electrode and the upper electrode and includes both a tetragonal crystal system and an orthorhombic crystal system;
a first doping layer that is between the lower electrode and the dielectric film and includes a first metal as a dopant;
a supporter pattern that is on at least one side of the lower electrode, wherein side walls of the supporter pattern are in direct contact with side walls of the lower electrode and a part of the first doping layer, and wherein an uppermost surface of the supporter pattern is in direct contact with the capacitor dielectric film;

wherein the first doping layer includes the first metal in an amount of 2 at % to 10 at %; and wherein an uppermost surface of the first doping layer and the uppermost surface of the supporter pattern are coplanar.

14. The semiconductor device of claim 13, wherein the first metal has four or more valence electrons.

15. The semiconductor device of claim 13, further comprising:
a second doping layer that is between the dielectric film and the upper electrode and includes a second metal.

16. The semiconductor device of claim 13,
wherein an uppermost surface of the first doping layer and the uppermost surface of the supporter pattern are coplanar.

* * * * *